(12) United States Patent
Doi et al.

(10) Patent No.: US 6,472,281 B2
(45) Date of Patent: *Oct. 29, 2002

(54) METHOD FOR FABRICATING SEMICONDUCTOR DEVICE USING A CVD INSULATOR FILM

(75) Inventors: Hiroyuki Doi, Kyoto (JP); Yasushi Okuda, Kyoto (JP); Keita Takahashi, Nara (JP); Nobuyuki Tamura, Osaka (JP)

(73) Assignee: Matsushita Electronics Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,584

(22) Filed: Jan. 28, 1999

(65) Prior Publication Data

US 2001/0026982 A1 Oct. 4, 2001

(30) Foreign Application Priority Data

Feb. 3, 1998 (JP) ............................................. 10-021651

(51) Int. Cl.⁷ ............................................. H01L 21/336
(52) U.S. Cl. ........................ 438/305; 438/264; 438/530
(58) Field of Search ................................. 438/257, 261, 438/264, 303, 305, 306, 307, 530

(56) References Cited

U.S. PATENT DOCUMENTS

| | | | | |
|---|---|---|---|---|
| 4,852,062 A | * | 7/1989 | Baker et al. ................. | 438/257 |
| 4,994,404 A | * | 2/1991 | Sheng et al. ................ | 438/305 |
| 5,015,598 A | * | 5/1991 | Verhaar ....................... | 438/305 |
| 5,145,797 A | * | 9/1992 | Nakanishi ................... | 438/303 |
| 5,166,087 A | | 11/1992 | Kakimoto et al. .......... | 438/305 |
| 5,208,175 A | * | 5/1993 | Choi et al. .................. | 438/261 |

FOREIGN PATENT DOCUMENTS

| | | |
|---|---|---|
| EP | 0 732 751 | 9/1996 |
| JP | 62-293776 | 12/1987 |
| JP | 63-076377 | 4/1988 |
| JP | 03-142841 | 6/1991 |

(List continued on next page.)

OTHER PUBLICATIONS

Wolf, Silicon Processing for the VLSI era, 1986, vol. 1, pp. 56–58.*
Notice of Reasons of Rejection. Application No. 11–015896, Mailing No. 2926400185, Mailing Date: Nov. 6, 2001, and Full English Translation.
Japanese Patent Application Laid Open Gazette No. 06–045595 and Full English Translation, "Buried Channel Type P–Channel Misfet", Feb. 18, 1994.

*Primary Examiner*—Chandra Chaudhari
(74) *Attorney, Agent, or Firm*—Nixon Peabody LLP; Donald R. Studebaker

(57) ABSTRACT

A gate insulator film and a gate electrode are formed on an Si substrate, and a CVD insulator film is deposited thereon to cover the gate electrode. Then, arsenic ions are implanted into the Si substrate from above the CVD insulator film to form LDD layers. After sidewall spacers have been formed over the side faces of the gate electrode with the CVD insulator film interposed therebetween, source/drain layers are formed. Since the LDD layers are formed by implanting dopant ions through the CVD insulator film, the passage of arsenic ions through the ends of the gate electrode can be suppressed. As a result, a semiconductor device suitable for miniaturization can be formed, while suppressing deterioration in insulating properties of the gate oxide film due to the passage of dopant ions through the ends of the gate electrode.

7 Claims, 14 Drawing Sheets

FOREIGN PATENT DOCUMENTS

| | | |
|---|---|---|
| JP | 03-157938 | 7/1991 |
| JP | 04-241425 | 8/1992 |
| JP | 05-067776 | 3/1993 |
| JP | 06-013401 | 1/1994 |
| JP | 06-196497 | 7/1994 |
| JP | 06-350093 | 12/1994 |
| JP | 7-135265 | 5/1995 |
| JP | 07-135308 | 5/1995 |
| JP | 7-202045 | 8/1995 |
| JP | 07-263682 | 10/1995 |
| JP | 8-181229 | 7/1996 |
| JP | 08-250609 | 9/1996 |
| JP | 08-321607 | 12/1996 |
| JP | 9-134973 | 5/1997 |
| JP | 10-065028 | 3/1998 |
| JP | 11-074525 | 3/1999 |

* cited by examiner

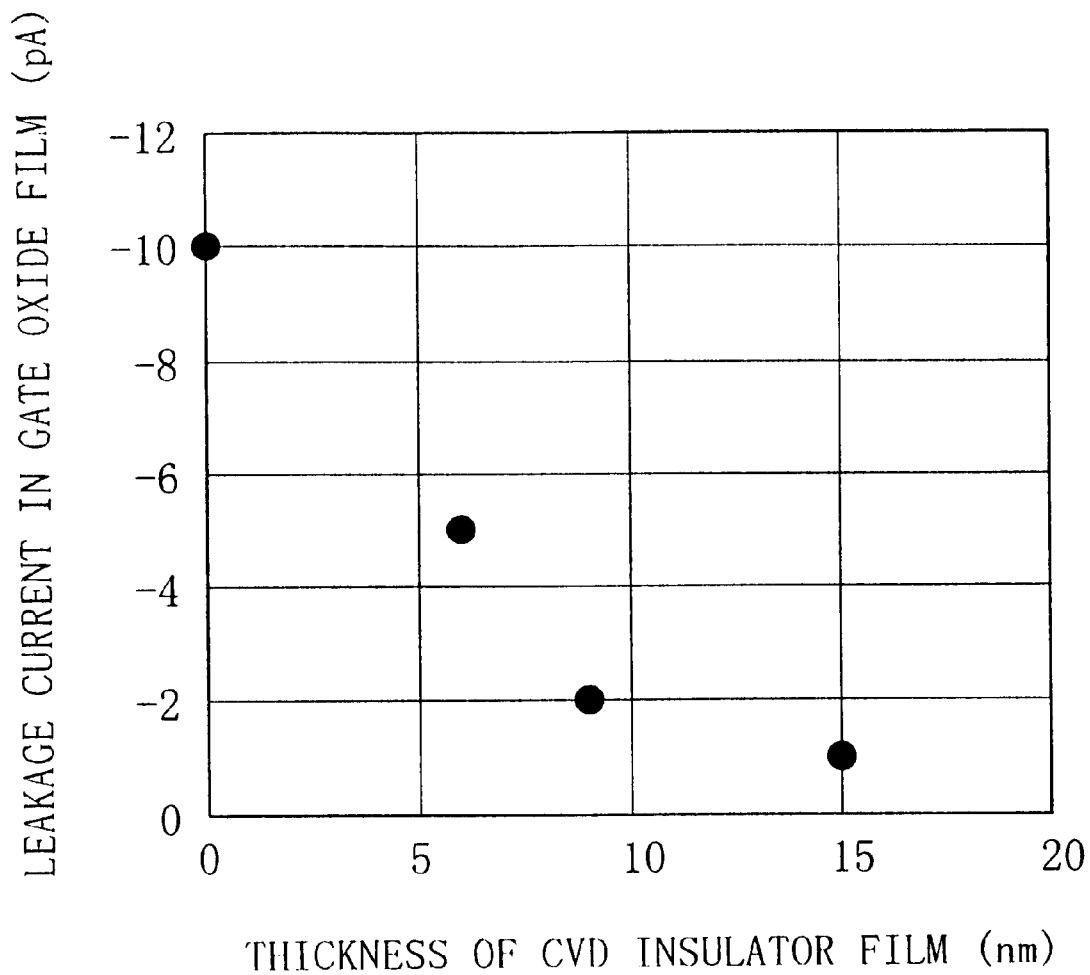

METHOD FOR FABRICATING SEMICONDUCTOR DEVICE USING A CVD INSULATOR FILM

BACKGROUND OF THE INVENTION

The present invention relates to a method for fabricating a semiconductor device including a highly reliable gate insulator film and functioning as an MOS field effect transistor (MOSFET) or a nonvolatile semiconductor memory device.

In a great number of fields, semiconductor devices such as MOSFET's or nonvolatile semiconductor memory devices have been used very widely and frequently. As is well known in the art, in a MOSFET, a gate electrode is formed on a gate insulator film, an underlying region of which functions as channel region. Source/drain layers are formed on both sides of the channel. And the value of current flowing between the source/drain layers and the ON/OFF states of the device are controlled based on a voltage applied to the gate electrode. A nonvolatile semiconductor memory device includes not only the members of a MOSFET but also a floating gate electrode, interposed between the gate insulator film and the gate electrode of a MOSFET, for retaining charges.

FIGS. 15(a) through 15(d) are cross-sectional views illustrating respective process steps for fabricating a prior art semiconductor device functioning as a MOSFET. As shown in FIG. 15(d), the device includes: a semiconductor substrate 111; a gate oxide film 112; a gate electrode 113; LDD layers 115a and 115b; sidewall spacers 116a and 116b; and source/drain layers 117 and 118. In FIG. 15(b), the reference numeral 114 denotes arsenic ions implanted as dopant ions into the substrate 111 to form the LDD layers 115a and 115b.

Hereinafter, a method for fabricating the prior art semiconductor device will be described with reference to FIGS. 15(a) through 15(d).

First, in the process step shown in FIG. 15(a), a gate electrode 113 is formed over an Si substrate 111 of a first conductivity type (e.g., P-type) with a gate oxide film 112 interposed therebetween.

Next, in the process step shown in FIG. 15(b), arsenic ions 114 are implanted as low-concentration dopant ions of a second conductivity type from above the gate electrode 113 into the Si substrate 111. As a result, LDD layers 115a and 115b are formed inside the Si substrate 111 on both sides of the gate electrode 113.

Then, in the process step shown in FIG. 15(c), an insulator film such as a silicon dioxide film is deposited over the substrate, and then etched anisotropically to form sidewall spacers 116a and 116b on the side faces of the gate electrode 113. In this process step, portions of the gate oxide film 112, not covered with the gate electrode 113 or the sidewall spacers 116a and 116b, are also etched.

Thereafter, in the process step shown in FIG. 15(d), arsenic ions are implanted as high-concentration dopant ions of the second conductivity type from above the gate electrode 113 and the sidewall spacers 116a and 116b into the Si substrate 111. As a result, source/drain layers 117 and 118 are formed along the outer periphery of the LDD layers 115a and 115b, respectively.

A nonvolatile semiconductor memory device having a structure in which gate oxide film, floating gate electrode, ONO film and control gate electrode are stacked one upon the other is also formed basically by performing the same steps as those shown in FIGS. 15(a) through 15(d).

A conventional MOSFET or nonvolatile semiconductor memory device having such a structure has problems that the leakage or disturb characteristics (variation in threshold voltage with time) thereof are greatly variable or deteriorative and that the values themselves should also be improved to a large degree. In order to spot the root of these problems, the present inventors carried out intensive research on what brings about such variation or deterioration in characteristics. As a result, we arrived at a conclusion that such variation or deterioration might possibly result from the damage caused at the ends of a gate oxide film during the implantation of dopant ions. Specifically, in the process step of implanting dopant ions as shown in FIG. 15(b), the ions are usually implanted obliquely, e.g., at a tilt angle of about 7 degrees with respect to a normal of the substrate surface to prevent channeling. Accordingly, during this process step, the dopant ions might pass through the ends of the gate oxide film to be unintentionally introduced into the gate oxide film. Similarly, in a nonvolatile semiconductor memory device, dopants seem to be accidentally introduced into an interlevel dielectric film made of ONO, for example, as well as into the gate oxide film.

Also, it was already observed that unwanted bird's beaks are formed at locally thickened ends of a gate oxide film during a fabrication process including a processing step of conducting a heat treatment in an oxidizing ambient. If such bird's beaks are formed, then the gate length has virtually increased. Thus, the same effects as those caused with an increased gate length are possibly brought about. That is to say, the threshold voltage might become variable.

In a nonvolatile semiconductor memory device, in particular, if bird's beaks are formed in a gate oxide film, then the efficiency, with which electrons are injected/ejected into/out of the gate, adversely deteriorates. Also, if bird's beaks are formed in an interlevel dielectric film between floating gate and control gate electrodes, then stress might be locally applied to these beaks, resulting in deterioration in characteristics of the device.

SUMMARY OF THE INVENTION

An object of this invention is providing a method for fabricating a semiconductor device functioning as a MOSFET with characteristics such as threshold voltage less variable or improved by taking various measures to prevent damage or bird's beaks from being caused at both ends of a gate oxide film.

Another object of the present invention is providing a method for fabricating a semiconductor device functioning as a nonvolatile semiconductor memory device with characteristics such as threshold voltage less variable or improved by taking various measures to prevent damage or bird's beaks from being caused in a gate oxide film.

A first method according to the present invention is a method for fabricating a semiconductor device functioning as an MOS field effect transistor. The method includes the steps of: a) forming a gate insulator film and a gate electrode on a semiconductor substrate in this order; b) forming a CVD insulator film to cover an exposed surface of the gate electrode by performing a CVD process; c) forming LDD layers in the semiconductor substrate by implanting dopant ions into the semiconductor substrate from above the gate electrode and the CVD insulator film; d) forming sidewall spacers over the side faces of the gate electrode with the CVD insulator film interposed therebetween; and e) forming source/drain layers in the semiconductor substrate.

In accordance with this method, it is possible to suppress the passage of dopant ions, implanted into the semiconductor substrate in the step c), through the ends of the gate electrode, resulting in the suppression of damage caused in the gate insulator film. Accordingly, a semiconductor device including a highly reliable gate insulator film can be fabricated and the reliability of the semiconductor device can be improved. In addition, since an insulator film can be grown by CVD at a temperature as low as 800° C. or less, no bird's beaks are formed in the gate insulator film. Thus, the CVD insulator film constitutes no obstacle to the miniaturization of a semiconductor device. Furthermore, since the gate electrode is covered with the CVD insulator film, it is possible to prevent the dopants introduced into the gate electrode from diffusing to pass through the gate electrode. As a result, a semiconductor device with less variable characteristics can be formed.

In one embodiment of the present invention, the first method may further include, between the steps b) and c), the step of etching anisotropically the CVD insulator film to leave the CVD insulator film at least on the side faces of the gate electrode.

In such an embodiment, portion of the CVD insulator film on the semiconductor substrate can be removed and thus the implant energy of the dopant ions can be reduced during the formation of the LDD layers. Accordingly, it is possible to suppress the passage of the dopant ions through both ends of the gate electrode with much more certainty.

It should be noted that if the steps of forming the CVD insulator film and implanting the dopant ions are performed two or more, an LDD structure having a gentler dopant concentration profile can be obtained and a semiconductor device with excellent electrical characteristics can be obtained.

In another embodiment of the present invention, the thickness of the CVD insulator film is preferably in the range from 5 nm to 30 nm.

In such an embodiment, it is possible to reduce the damage caused in the gate insulator film due to the ion implantation with more certainty. In addition, the LDD layers and the gate electrode can overlap with each other by an appropriate distance without conducting an excessive heat treatment.

In another embodiment of the present invention, the first method may further include, posterior to the step c), the step of conducting a heat treatment within an ambient containing at least oxygen to repair damage caused in the gate insulator film due to the implantation of the dopant ions.

In such an embodiment, the leakage resulting from the existence of damage can be reduced more effectively and unwanted phenomena such as variation in threshold voltage with time can be suppressed.

In still another embodiment, the step of conducting a heat treatment is preferably performed within an oxidizing and nitriding ambient.

In such an embodiment, carrier trapping can also be reduced, because dangling bonds existing between the gate insulator film and the semiconductor substrate can be repaired.

A second method according to the present invention is a to method for fabricating a semiconductor device functioning as an MOS field effect transistor. The method includes the steps of: a) forming a gate insulator film and a gate electrode on a semiconductor substrate in this order; b) forming an insulating coating to cover an exposed surface of the gate electrode; c) forming LDD layers in the semiconductor substrate by implanting dopant ions into the semiconductor substrate from above the gate electrode and the insulating coating; d) conducting a heat treatment within an ambient containing at least oxygen to repair damage caused in the gate insulator film due to the implantation of the dopant ions; e) forming sidewall spacers over the side faces of the gate electrode with the insulating coating interposed therebetween; and f) forming source/drain layers in the semiconductor substrate.

In accordance with this method, the leakage resulting from the existence of damage in the gate insulator film can be reduced more effectively and unwanted phenomena such as variation in threshold voltage with time can be suppressed.

In one embodiment of the present invention, the step d) is preferably performed within an oxidizing and nitriding ambient.

In such an embodiment, carrier trapping can also be reduced, because dangling bonds can be repaired.

In another embodiment of the present invention, the heat treatment is preferably conducted in the step d) as rapid thermal annealing at a temperature in the range from 800° C. to 1100° C. within 120 seconds.

In such an embodiment, it is possible to suppress variation in device characteristics due to the bird's beaks formed in the gate insulator film.

A third method according to the present invention is a method for fabricating a semiconductor device functioning as a nonvolatile semiconductor memory device. The method includes the steps of: a) forming a gate insulator film, a floating gate electrode, an interlevel dielectric film and a control gate electrode on a semiconductor substrate in this order; b) forming a CVD insulator film to cover the surfaces of the floating gate electrode, the interlevel dielectric film and the control gate electrode by performing a CVD process; and c) forming source/drain layers in the semiconductor substrate by implanting dopant ions into the semiconductor substrate from above the CVD insulator film, the control gate electrode, the interlevel dielectric film and the floating gate electrode.

In accordance with this method, it is possible to suppress the passage of the dopant ions, implanted into the semiconductor substrate in the step c), through the ends of the floating gate electrode, resulting in the suppression of damage caused at the ends of the gate insulator film. Accordingly, a nonvolatile semiconductor memory device including a highly insulating and reliable gate insulator film can be fabricated. As a result, rewriting can be performed in the nonvolatile semiconductor memory device a considerably larger number of times and various disturb characteristics can be improved. In addition, since an insulator film can be grown by CVD at a temperature as low as 800° C. or less, no bird's beaks are formed in the gate insulator film. Thus, the CVD insulator film constitutes no obstacle to the miniaturization of a semiconductor device. Furthermore, since the side faces of the floating gate electrode are covered with the CVD insulator film, it is possible to prevent the dopants introduced into the floating gate electrode from diffusing to pass through the gate electrode. As a result, a nonvolatile semiconductor memory device exhibiting less variable characteristics and excelling in charge retention time can be fabricated.

In one embodiment of the present invention, the third method may further include, between the steps b) and c), the step of etching anisotropically the CVD insulator film to leave the CVD insulator film at least on the side faces of the floating gate electrode.

In another embodiment, the thickness of the CVD insulator. film is preferably in the range from 5 nm to 30 nm.

In still another embodiment, the third method may further include, posterior to the step c), the step of conducting a heat treatment within an ambient containing at least oxygen to repair damage caused in the gate insulator film due to the implantation of the dopant ions.

In such an embodiment, the variation in threshold voltage with time can be reduced and rewriting can be performed an even larger number of times.

In still another embodiment, the step of conducting a heat treatment may be performed within an oxidizing and nitriding ambient.

In such an embodiment, carrier trapping can also be reduced, because dangling bonds existing between the gate insulator film and the semiconductor substrate can be repaired.

A fourth method according to the present invention is a method for fabricating a semiconductor device functioning as a nonvolatile semiconductor memory device. The method includes the steps of: a) forming a gate insulator film, a floating gate electrode, an interlevel dielectric film and a control gate electrode on a semiconductor substrate in this order; b) forming an insulating coating to cover the surfaces of the floating gate electrode, the interlevel dielectric film and the control gate electrode; c) forming source/drain layers in the semiconductor substrate by implanting dopant ions into the semiconductor substrate from above the insulating coating, the control gate electrode, the interlevel dielectric film and the floating gate electrode; and d) conducting a heat treatment within an ambient containing at least oxygen to repair damage caused in the gate insulator film due to the implantation of the dopant ions.

In accordance with this method, the leakage characteristics resulting from the damage in the gate insulator film can be improved. Accordingly, variation in threshold voltage with time can be reduced and rewriting can be performed a far larger number of times.

In one embodiment of the present invention, the step d) may be performed within an oxidizing and nitriding ambient.

In such an embodiment, carrier trapping can also be reduced, because dangling bonds existing between the gate insulator film and the semiconductor substrate can be repaired.

In another embodiment of the present invention, the heat treatment is preferably conducted in the step d) as rapid thermal annealing at a temperature in the range from 800° C. to 1100° C. within 120 seconds.

BRIEF DESCRIPTION OF THE DRAWINGS

FIG. 3 is a graph illustrating how leakage current flowing through a gate oxide film varies with the thickness of a CVD insulator film (silicon dioxide film) in respective embodiments of the present invention.

DESCRIPTION OF THE PREFERRED EMBODIMENTS

Embodiment 1

Hereinafter, the first embodiment of the present invention will be described. FIGS. 1(a) through 1(e) are cross-sectional views illustrating respective process steps for fabricating a semiconductor device functioning as a MOSFET according to this embodiment.

Figure 1A:
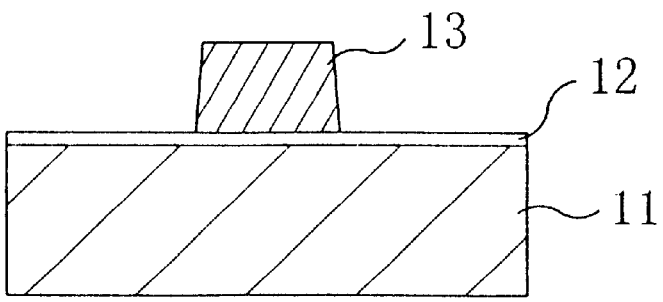
FIGS. 1(a) through 1(e) are cross-sectional views illustrating respective process steps for fabricating a semiconductor device functioning as a MOSFET according to the first embodiment of the present invention.
Figure 1B:
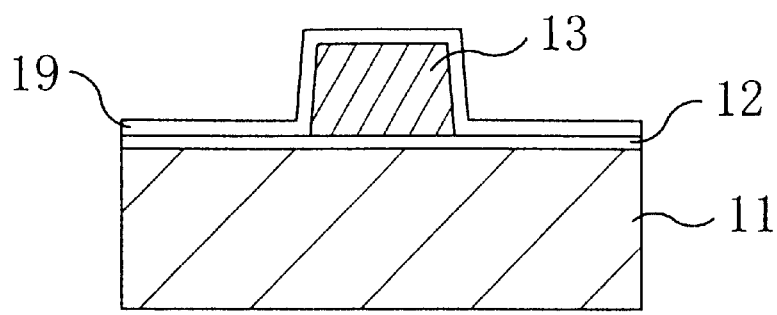
Figure 1C:
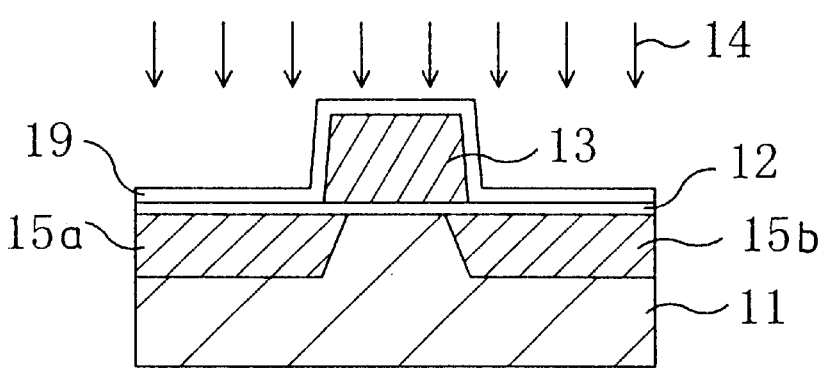
Figure 1D:
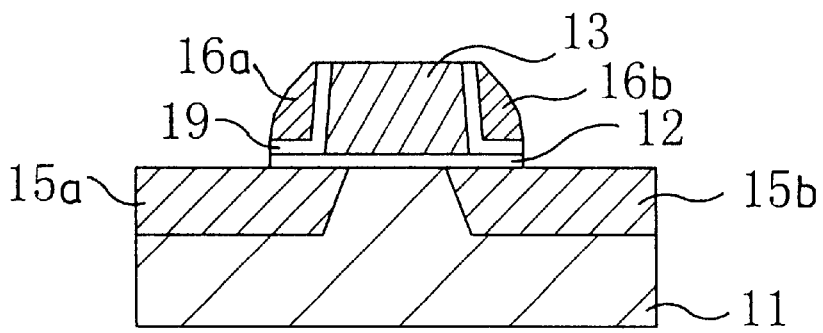
Figure 1E:
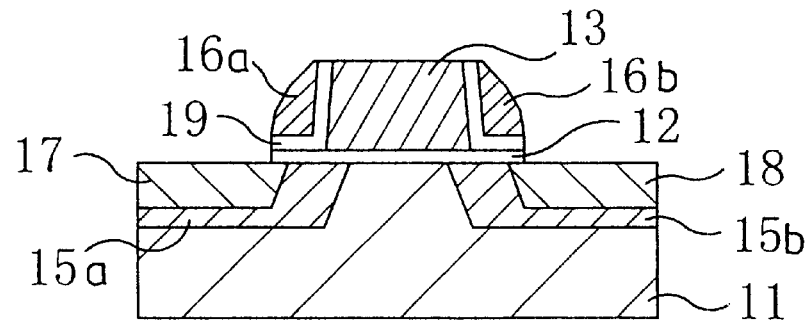

As shown in FIG. 1(e), the device includes: an Si substrate 11; a gate oxide film 12; a gate electrode 13; LDD layers 15a and 15b; sidewall spacers 16a and 16b; source/drain layers 17 and 18; and a CVD insulator film 19. The CVD insulator film 19 is made of silicon dioxide deposited by a CVD process. In FIG. 1(c), the reference numeral 14 denotes arsenic ions implanted as dopant ions into the Si substrate 11 to form the LDD layers 15a and 15b.

First, in the process step shown in FIG. 1(a), a gate oxide film 12, made of silicon dioxide, is formed by pyrogenic oxidation technique to be 9 nm thick on the P-type silicon substrate 11. And then, a gate electrode 13 made of phosphorus-doped polysilicon is formed thereon.

Next, in the process step shown in FIG. 1(b), a CVD insulator film 19, made of silicon dioxide, is deposited by reduced pressure CVD (RPCVD) to be 10 nm thick over the substrate to cover the gate oxide film 12 and the gate electrode 13.

Then, in the process step shown in FIG. 1(c), arsenic ions 14 are implanted into the Si substrate 11 from above the gate electrode 13 and the CVD insulator film 19 to form N-type LDD layers 15a and 15b in the Si substrate 11 on both sides of the gate electrode 13. The implantation is performed under the conditions that the implant energy is 50 keV and the dose is $5 \times 10^{14}$ cm$^{-2}$, for example. Also, in order to make the LDD layers 15a and 15b extend to reach a region near the gate electrode 13, the ions are implanted at a tilt angle of about 25 degrees with respect to a normal of the substrate (where implantation is performed at four steps).

Subsequently, in the process step shown in FIG. 1(d), a TEOS film is deposited over the substrate and etched anisotropically to form sidewall spacers 16a and 16b over the side faces of the gate electrode 13 with the CVD insulator film 19 interposed therebetween. During this process step, portions of the gate oxide film 12 and the CVD insulator film 19 on the Si substrate 11 are removed.

Finally, in the process step shown in FIG. 1(e), arsenic ions are implanted into the Si substrate 11 from above the gate electrode 13, the CVD insulator film 19 and the sidewall spacers 16a and 16b. As a result, N-type source/drain layers 17 and 18 are formed in the Si substrate 11 along the outer periphery of the LDD layers 15a and 15b. The implantation is performed under the conditions that the implant energy is 50 keV and the dose is $2 \times 10^{15}$ cm$^{-2}$, for example. Also, in order to prevent channeling, the ions are implanted at a tilt angle of about 7 degrees with respect to a normal of the substrate.

In accordance with the method of this embodiment, the side faces of the gate electrode 13 are covered with the CVD insulator film 19 in the process step shown in FIG. 1(c). Accordingly, it is possible to suppress the passage and introduction of the arsenic ions 14, implanted into the Si substrate 11 to form the LDD layers 15a and 15b, through the ends of the gate electrode 13 into the gate oxide film 12 under the electrode 13. Thus, the damage caused in the gate oxide film 12, specifically, portion of the gate oxide film 12 actually functioning as a gate insulator film under the gate electrode 13, by the conventional method can be suppressed. As a result, a semiconductor device including a highly insulating and reliable gate oxide film can be obtained. In other words, the reliability of a semiconductor device functioning as a MOSFET can be improved. It should be noted that in this specification, the "damage in the gate oxide film" means the damage caused in the portion of the film actually functioning as a gate insulator film under the gate electrode.

In addition, the CVD insulator film 19 is grown by a CVD process at a temperature as low as about 800° C. or less. Accordingly, unlike forming a thick protective oxide film by conducting thermal oxidation at a relatively high temperature, no bird's beaks are formed at both ends of the portion of the gate oxide film 12 under the gate electrode 13, i.e., the portion actually functioning as a gate insulator film. Thus, the gate length can be controlled accurately and this method is advantageously applicable to the miniaturization of a semiconductor device. Also, since a CVD process is conducted at a lower temperature than a thermal oxidation process, it is possible to suppress the diffusion of the dopants such as phosphorus introduced into the gate electrode 13 toward the gate oxide film 12 under the electrode 13 or the Si substrate 11.

Furthermore, by covering the gate electrode 13 with the CVD insulator film 19, it is also possible to prevent the dopants in the gate electrode 13 from diffusing toward the side and upper surfaces thereof. As a result, a semiconductor device with less variable characteristics can be advantageously obtained.

It is noted that before or after the step of implanting arsenic ions 14 as shown in FIG. 1(c), B (boron) or BF$_2$ ions may be implanted into the Si substrate 11 from above the CVD insulator film 19 and the gate oxide film 12 to form a P-type layer as a punch through stopper. Also, P (phosphorus) ions may be implanted instead of arsenic ions. It is clear that the same effects as those of this embodiment can be attained even in these cases.

Embodiment 2

Next, the second embodiment of the present invention will be described. FIGS. 2(a) through 2(e) are cross-sectional views illustrating respective process steps for fabricating a semiconductor device functioning as a MOSFET of this embodiment.

Figure 2A:
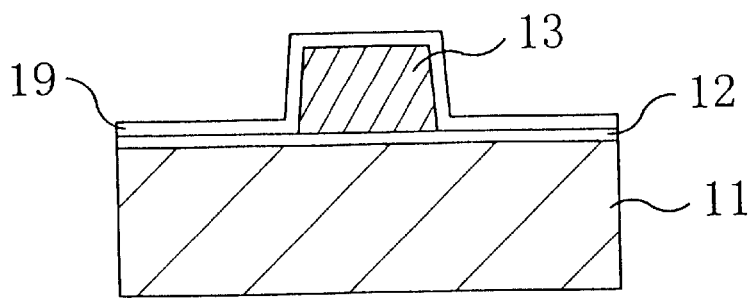
FIGS. 2(a) through 2(e) are cross-sectional views illustrating respective process steps for fabricating a semiconductor device functioning as a MOSFET according to the second embodiment of the present invention.
Figure 2B:
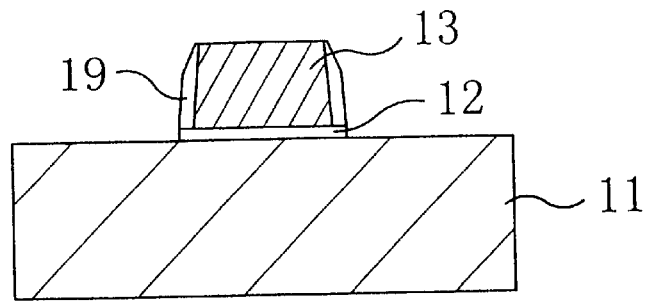
Figure 2C:
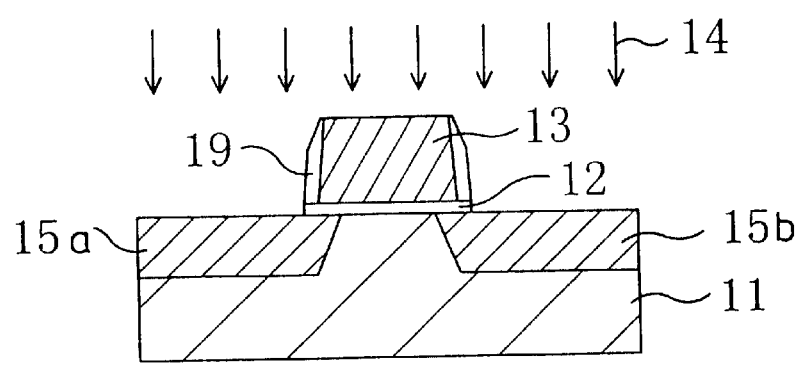
Figure 2D:
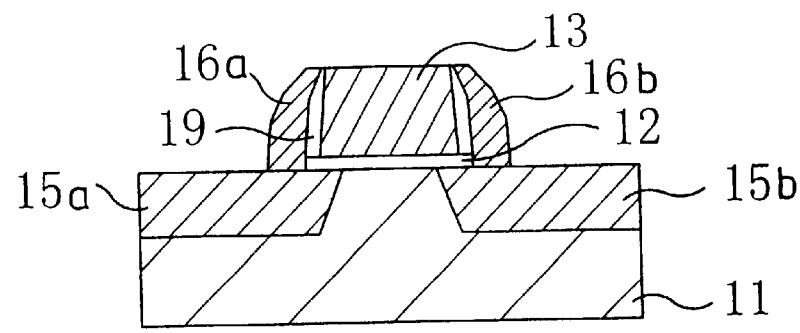
Figure 2E:
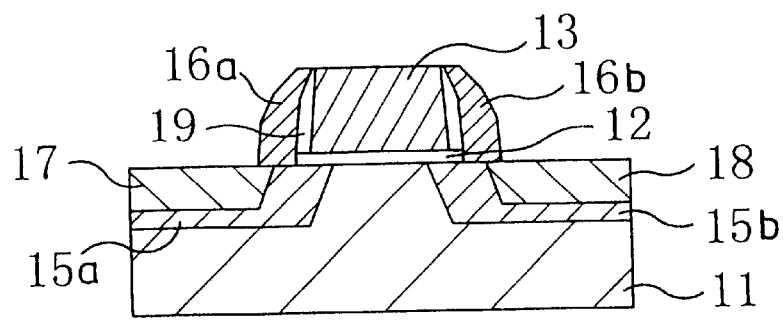

As shown in FIG. 2(e), the device includes: an Si substrate 11; a gate oxide film 12; a gate electrode 13; LDD layers 15a and 15b; sidewall spacers 16a and 16b; source/drain layers 17 and 18; and a CVD insulator film 19. The CVD insulator film 19 is made of silicon dioxide deposited by a CVD process. In FIG. 2(c), the reference numeral 14 denotes arsenic ions implanted as dopant ions into the Si substrate 11 to form the LDD layers 15a and 15b.

First, in the process step shown in FIG. 2(a), a gate oxide film 12, made of silicon dioxide, is formed to be 9 nm thick on a P-type silicon substrate 11. And then, a gate electrode 13, made of phosphorus-doped polysilicon, is formed thereon.

Next, in the process step shown in FIG. 2(b), a CVD insulator film 19, made of silicon dioxide, is deposited by RPCVD to be 10 nm thick over the substrate to cover the gate oxide film 12 and the gate electrode 13. Then, the CVD insulator film 19 is etched anisotropically, thereby removing the CVD insulator film 19 except for its portions on the side faces of the gate electrode 13 and the gate oxide film 12 except for its portion under the gate electrode 13.

Then, in the process step shown in FIG. 2(c), arsenic ions 14 are implanted into the Si substrate 11 from above the gate electrode 13 and the CVD insulator film 19 to form N-type LDD layers 15a and 15b in the Si substrate 11 on both sides of the gate electrode 13. The implantation is performed under the conditions that the implant energy is 30 keV and the dose is $5 \times 10^{14}$ cm$^{-2}$, for example. Also, in order to make the LDD layers 15a and 15b extend to reach a region near the gate electrode 13, the ions are implanted at a tilt angle of about 25 degrees with respect to a normal of the substrate (where implantation is performed at four steps).

Subsequently, in the process step shown in FIG. 2(d), a TEOS film is deposited over the substrate and etched anisotropically to form sidewall spacers 16a and 16b out of the TEOS film over the side faces of the gate electrode 13 with the CVD insulator film 19 interposed therebetween.

Finally, in the process step shown in FIG. 2(e), arsenic ions are implanted into the Si substrate 11 from above the gate electrode 13, the CVD insulator film 19 and the sidewall spacers 16a and 16b. As a result, N-type source/drain layers 17 and 18 are formed in the Si substrate 11 along the outer periphery of the LDD layers 15a and 15b. The implantation is performed under the conditions that the implant energy is 50 keV and the dose is $2\times10^{15}$ cm$^{-2}$, for example. Also, in order to prevent channeling, the ions are implanted at a tilt angle of about 7 degrees with respect to a normal of the substrate.

In accordance with the method of this embodiment, the side faces of the gate electrode 13 are covered with the CVD insulator film 19 in the process step shown in FIG. 2(c). Accordingly, it is possible to suppress the passage of the arsenic ions 14, implanted into the Si substrate 11 to form the LDD layers 15a and 15b, through the ends of the gate electrode 13. Thus, the same effects as those of the first embodiment can also be attained in this embodiment. In the method of this embodiment, in particular, the CVD insulator film 19 has been removed in the process step shown in FIG. 2(b) except for its portions on the side faces of the gate electrode 13. Accordingly, the implant energy may be smaller during the implantation of the dopant ions. As a result, the quantity of dopants passing through the CVD insulator film 19 on the side faces of the gate electrode 13 to reach the gate oxide film 12 can be advantageously reduced as compared with the fabrication process of the first embodiment.

It should be noted that before or after the step of implanting arsenic ions 14 shown in FIG. 2(c), B (boron) or BF$_2$ ions may be implanted into the Si substrate 11 from above the CVD insulator film 19 and the gate oxide film 12 to form a P-type layer as a punch through stopper. It is clear that the same effects as those of this embodiment can be attained even in such a case.

Also, if the steps of depositing the CVD insulator film 19 and implanting dopant ions to form the LDD layers 15a and 15b are repeatedly performed twice or more with a gradually increased doping level, then an LDD structure having a gentler dopant concentration profile can be obtained. As a result, a semiconductor device exhibiting excellent electrical characteristics is realized.

Appropriate Thickness Range of CVD Insulator Film

Next, an appropriate thickness range of the CVD insulator film 19 defined in the first and second embodiments will be described.

FIG. 3 is a graph illustrating how leakage current flowing through the gate oxide film varies with the thickness of the CVD insulator film. In FIG. 3, the axis of abscissas indicates the thickness of the CVD insulator film, while the axis of ordinates indicates the leakage current flowing through the gate oxide film. As shown in FIG. 3, if the thickness of the CVD insulator film deposited is 5 nm or more, then the leakage current flowing through the gate oxide film drastically decreases. Thus, it can be understood that the deposition of the CVD insulator film greatly contributes to the reduction of the damage caused in the gate oxide film due to the ion implantation. As shown in FIG. 3, the thicker the CVD insulator film is, the more remarkably the damage can be reduced. However, in order to overlap the LDD layers with the gate electrode by an appropriate distance without conducting excessive heat treatment, the thickness of the CVD insulator film is preferably 30 nm or less.

In the first and second embodiments, the CVD insulator film 19 is made of silicon dioxide. Alternatively, the CVD insulator film 19 may be made of silicon nitride. With the silicon dioxide CVD insulator film 19, stress applied to the underlying film can be smaller than a silicon nitride film. On the other hand, with a silicon nitride CVD insulator film 19, the formation of bird's beaks in the gate oxide film 12 can be advantageously suppressed more effectively during subsequent process steps performed at a high temperature like diffusing the dopants. The same trade-off rule is also true of the embodiments of a MOSFET to be described below.

Embodiment 3

Figure 4A:
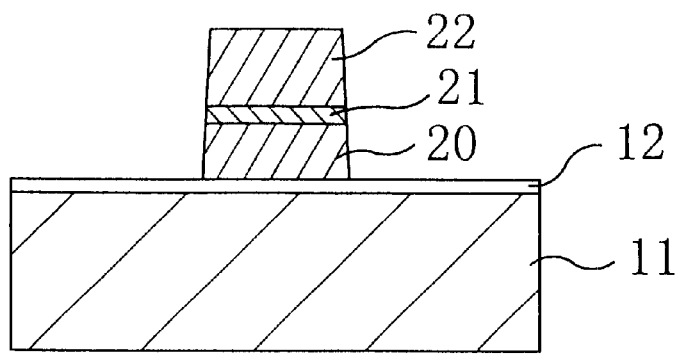
FIGS. 4(a) through 4(c) are cross-sectional views illustrating respective process steps for fabricating a semiconductor device functioning as a nonvolatile semiconductor memory device according to the third embodiment of the present invention.
Figure 4B:
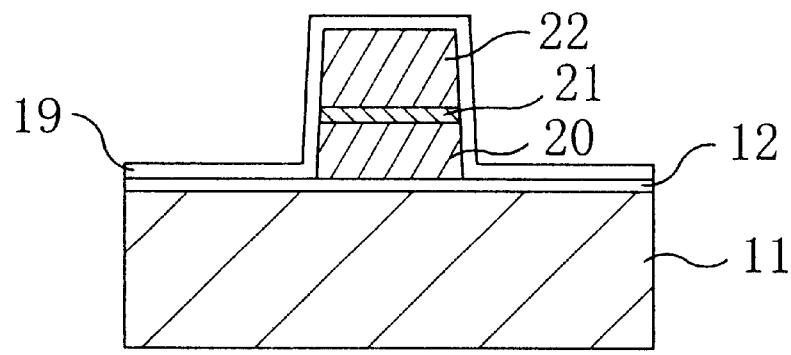
Figure 4C:
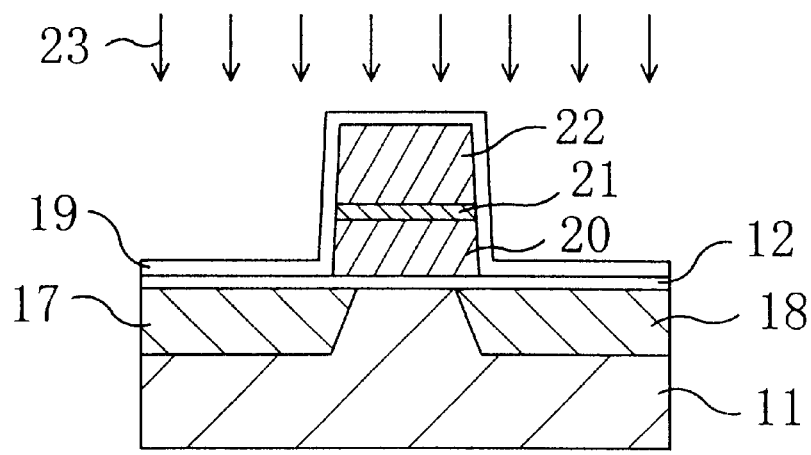

Next, the third embodiment of the present invention will be described. FIGS. 4(a) through 4(c) are cross-sectional views illustrating respective process steps for fabricating a semiconductor device functioning as a nonvolatile semiconductor memory device of this embodiment.

As shown in FIG. 4(c), the device includes: an Si substrate 11; a gate oxide film 12; source/drain layers 17 and 18; an insulating coating 19 deposited by CVD; a floating gate electrode 20; an interlevel dielectric film 21; and a control gate electrode 22. In FIG. 4(c), the reference numeral 23 denotes phosphorus ions implanted as dopant ions into the Si substrate 11 to form the source/drain layers 17 and 18.

First, in the process step shown in FIG. 4(a), a gate oxide film 12, made of silicon dioxide, is formed to be 9 nm thick on a P-type silicon substrate 11. Then, a floating gate electrode 20 made of phosphorus-doped polysilicon, an interlevel dielectric film 21 made of ONO (three-layered film in which a nitride film is sandwiched between a pair of oxide films), and a control gate electrode 22 made of phosphorusdoped polysilicon are sequentially stacked thereon.

Next, in the process step shown in FIG. 4(b), a CVD insulator film 19, made of silicon dioxide, is deposited by RPCVD to be 10 nm thick over the substrate to cover the gate oxide film 12 and the multilevel structure including the floating gate electrode 20, interlevel dielectric film 21 and control gate electrode 22.

Subsequently, in the process step shown in FIG. 4(c), phosphorus ions 23 are implanted into the Si substrate 11 from above the control gate electrode 22, the interlevel dielectric film 21 and floating gate electrode 20 covered with the CVD insulator film 19. As a result, N-type source/drain layers 17 and 18 are formed in the Si substrate 11 on both sides of the floating gate electrode 20. The implantation is performed under the conditions that the implant energy is 70 keV and the dose is $5\times10^{15}$ cm$^{-2}$, for example. Also, in order to prevent channeling, the ions are implanted at a tilt angle of about 7 degrees with respect to a normal of the substrate surface.

In accordance with the method of this embodiment, the side faces of the floating gate electrode 20 are covered with the CVD insulator film 19 in the process step shown in FIG. 4(c). Accordingly, it is possible to suppress the passage of phosphorus ions through the ends of the floating gate and control gate electrodes 20, 22. Thus, a nonvolatile semiconductor memory device including highly insulating and reliable gate oxide film 12 and interlevel dielectric film 21 can be obtained. In addition, rewriting can be performed in the nonvolatile semiconductor memory device a far greater number of times and various disturb characteristics can be improved.

Moreover, the CVD insulator film 19 is grown by a CVD process at a temperature as low as about 800° C. or less. Accordingly, unlike forming a thick protective oxide film by thermal oxidation, both ends of the portion of the gate oxide film 12 under the floating gate electrode 20, i.e., its portion actually functioning as a gate insulator film, are not thickened. In other words, no bird's beaks are formed at the ends. Thus, the gate length can be controlled accurately and this method is advantageously applicable to the miniaturization of a semiconductor device. Similarly, thickening (or formation of bird's beaks) at the ends of the ONO interlevel dielectric film 21 can also be suppressed. Accordingly, it is also possible to suppress the variation in characteristics of the device, which is ordinarily caused because of the local application of stress to the ends of an interlevel dielectric film.

Moreover, since a CVD process is conducted at a lower temperature than a thermal oxidation process, it is possible to prevent the dopants such as phosphorus introduced into the floating gate electrode 20 from diffusing downward to reach the gate oxide film 12 or the Si substrate 11.

Furthermore, by covering the floating gate and control gate electrodes 20, 22 with the CVD insulator film 19, it is also possible to prevent the dopants in these electrodes 20, 22 from diffusing to reach external members. As a result, a nonvolatile semiconductor memory device with less variable characteristics can be advantageously obtained.

Also, since the floating gate electrode 20 is covered with the CVD insulator film 19 of good quality, a nonvolatile semiconductor memory device excelling in charge retention characteristics can be obtained.

It should be noted that before or after the process step of implanting phosphorus ions 23 shown in FIG. 4(*c*), B (boron) or $BF_2$ ions may be implanted through the CVD insulator film 19 and the gate oxide film 12 into the Si substrate 11 to form a P-type layer as a threshold controlling layer or a punch through stopper. It is clear that the same effects as those of this embodiment can be attained even in such a case.

Embodiment 4

Figure 5A:
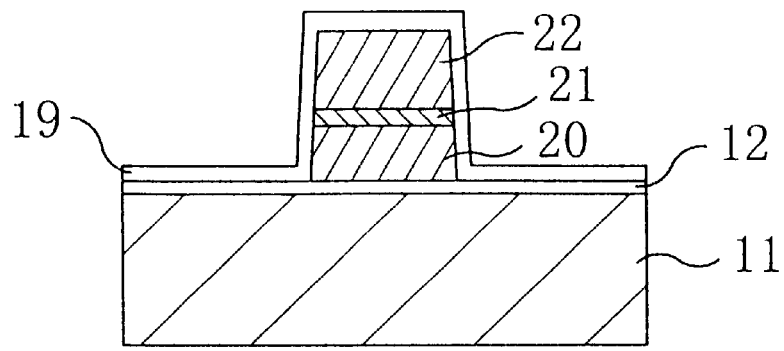
FIGS. 5(a) through 5(c) are cross-sectional views illustrating respective process steps for fabricating a semiconductor device functioning as a nonvolatile semiconductor memory device according to the fourth embodiment of the present invention.
Figure 5B:
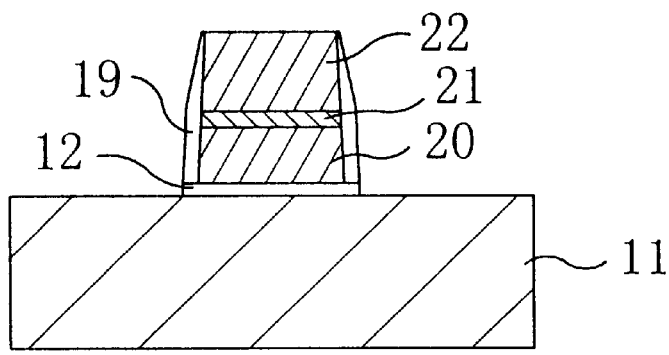
Figure 5C:
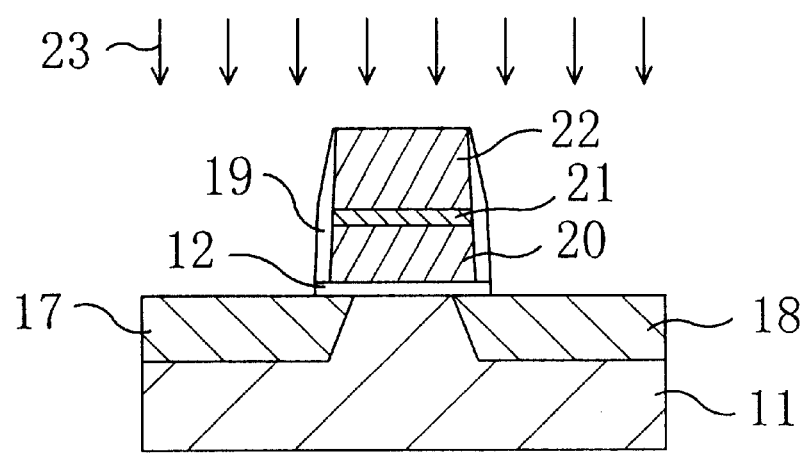

Next, the fourth embodiment of the present invention will be described. FIGS. 5(*a*) through 5(*c*) are cross-sectional views illustrating respective process steps for fabricating a semiconductor device functioning as a nonvolatile semiconductor memory device of this embodiment.

As shown in FIG. 5(*c*), the device includes: an Si substrate 11; a gate oxide film 12; source/drain layers 17 and 18; a CVD insulator film 19; a floating gate electrode 20; an interlevel dielectric film 21; and a control gate electrode 22. The CVD insulator film 19 is made of silicon dioxide deposited by a CVD process. In FIG. 5(*c*), the reference numeral 23 denotes phosphorus ions implanted as dopant ions into the Si substrate 11 to form the source/drain layers 17 and 18.

First, in the process step shown in FIG. 5(*a*), a gate oxide film 12, made of silicon dioxide, is formed to be 9 nm thick on a P-type silicon substrate 11. Then, a floating gate electrode 20 made of phosphorus-doped polysilicon, an interlevel dielectric film 21 made of ONO (three-layered film in which a nitride film is sandwiched between a pair of oxide films), and a control gate electrode 22 made of phosphorusdoped polysilicon are sequentially stacked thereon.

Next, in the process step shown in FIG. 5(*b*), a CVD insulator film 19, made of silicon dioxide, is deposited by RPCVD to be 10 nm thick over the substrate to cover the gate oxide film 12 and the multilevel structure including the floating gate electrode 20, interlevel dielectric film 21 and control gate electrode 22. Subsequently, the CVD insulator film 19 is etched anisotropically to leave its portions on the side faces of the floating gate electrode 20, interlevel dielectric film 21 and control gate electrode 22. At the same time, the gate oxide film 12 is also etched anisotropically to leave its portion under the floating gate electrode 20.

Then, in the process step shown in FIG. 5(*c*), phosphorus ions 23 are implanted into the Si substrate 11 from above the CVD insulator film 19, control gate electrode 22, interlevel dielectric film 21 and floating gate electrode 20. As a result, N-type source/drain layers 17 and 18 are formed in the Si substrate 11 on both sides of the floating gate electrode 20. The implantation is performed under the conditions that the implant energy is 50 keV and the dose is $5 \times 10^{15}$ cm$^{-2}$, for example. Also, in order to prevent channeling, the ions are implanted at a tilt angle of about 7 degrees with respect to a normal of the substrate surface.

In accordance with the method of this embodiment, the side faces of the floating gate electrode 20 are covered with the CVD insulator film 19 in the process step shown in FIG. 5(*c*). Accordingly, it is possible to suppress the passage and introduction of the phosphorus ions, implanted into the Si substrate 11 to form the source/drain layers 17 and 18, through the ends of the floating gate electrode 20 into the gate oxide film 12. Moreover, in the process step of growing the CVD insulator film 19, thickening, or formation of bird's beaks, involved with thermal oxidation, can be suppressed at both ends of the gate oxide film 12, as in the third embodiment. Thus, the gate length can be controlled accurately and this method is advantageously applicable to the miniaturization of a semiconductor device. Similarly, thickening (or formation of bird's beaks) at the ends of the ONO interlevel dielectric film 21 can also be suppressed. Accordingly, it is also possible to suppress the variation in device characteristics, ordinarily resulting from the local application of stress to the ends of an interlevel dielectric film. Thus, the same effects as those of the fourth embodiment can also be attained.

Also, if the steps of coating the gate electrodes 20, 22 with the CVD insulator film 19 and implanting the phosphorus ions are repeatedly performed twice or more with a gradually increased doping level, then a source/drain structure having a gentler dopant concentration profile can be obtained. As a result, a nonvolatile semiconductor memory device exhibiting excellent electrical characteristics is realized.

It should be noted that before or after the step of implanting phosphorus ions 23 shown in FIG. 5(*c*), B (boron) or $BF_2$ ions may be implanted into the Si substrate 11 from above the CVD insulator film 19 and the gate oxide film 12 to form a P-type layer as a threshold controlling layer or a punch through stopper. It is clear that the same effects as those of this embodiment can be attained even in such a case.

Appropriate Thickness Range of CVD Insulator Film

Next, an appropriate thickness range of the CVD insulator film 19 defined in the third and fourth embodiments will be described.

In the third and fourth embodiments, the appropriate thickness range of the CVD insulator film 19 is the same as that defined in the first and second embodiments. As can be understood from the dependence of leakage characteristics of the gate oxide film on the thickness of the CVD insulator film (see FIG. 3), if the thickness of the CVD insulator film is 5 nm or more, then the damage caused in the gate oxide film due to ion implantation can be greatly reduced. The thicker the CVD insulator film is, the more remarkably the damage can be reduced. However, in order to overlap the LDD layers with the gate electrode by an appropriate distance without conducting excessive heat treatment, the thickness of the CVD insulator film is preferably 30 nm or less.

In the third and fourth embodiments, the CVD insulator film 19 is made of silicon dioxide. Alternatively, the CVD insulator film 19 may be made of silicon nitride. With the silicon dioxide CVD insulator film 19, the stress applied to an underlying film can be smaller than a silicon nitride film. On the other hand, with a silicon nitride CVD insulator film 19, the formation of bird's beaks in the gate oxide film 12 and the interlevel dielectric film 21 can be advantageously suppressed more effectively during subsequent process steps performed at a high temperature like diffusing the dopants. The same trade-off rule is also true of the embodiments of a nonvolatile semiconductor memory device to be described below.

Embodiment 5

Figure 6:
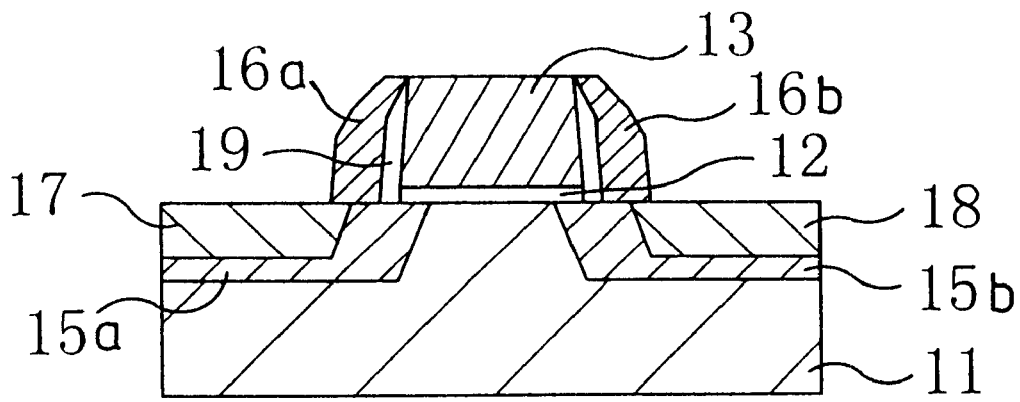
FIG. 6 is a cross-sectional view of a semiconductor device functioning as a MOSFET according to the fifth embodiment of the present invention.

Next, the fifth embodiment of the present invention will be described. FIG. 6 is a cross-sectional view of a semiconductor device functioning as a MOSFET of this embodiment.

As shown in FIG. 6, the device includes: a P-type Si substrate 11; an $SiO_2$ gate oxide film 12; a polysilicon gate electrode 13; N-type LDD layers 15a, 15b; TEOS sidewall spacers 16a, 16b; N-type source/drain layers 17 and 18; and a CVD insulator film 19 made of $SiO_2$ deposited by CVD.

The semiconductor device of this embodiment is characterized in that the gate oxide film 12 is formed only under the gate electrode 13 and that the sidewall spacers 16a and 16b are formed on the gate oxide film 12 and over the side faces of the gate electrode 13. Such a structure can be easily formed by patterning the gate oxide film 12 in the same shape as that of the gate electrode 13 in the step shown in FIG. 2(a) of the second embodiment and then performing the same process steps as those illustrated in FIGS. 2(b) through 2(e).

In this embodiment as well as in the second embodiment, it is also possible to suppress the deterioration in insulating properties of the gate oxide film 12 due to the passage of dopant ions through the ends of the gate electrode 13 during the implantation of dopant ions to form the LDD layers 15a and 15b. As a result, a semiconductor device including a highly insulating and reliable gate oxide film can be obtained. In other words, the reliability of the semiconductor device can be improved.

In addition, since the gate electrode 13 is covered with the CVD insulator film 19, the diffusion of the dopants, introduced into the gate electrode 13, toward the side and upper surfaces thereof can be suppressed. Consequently, a semiconductor device with less variable characteristics is realized.

Embodiment 6

Figure 7:
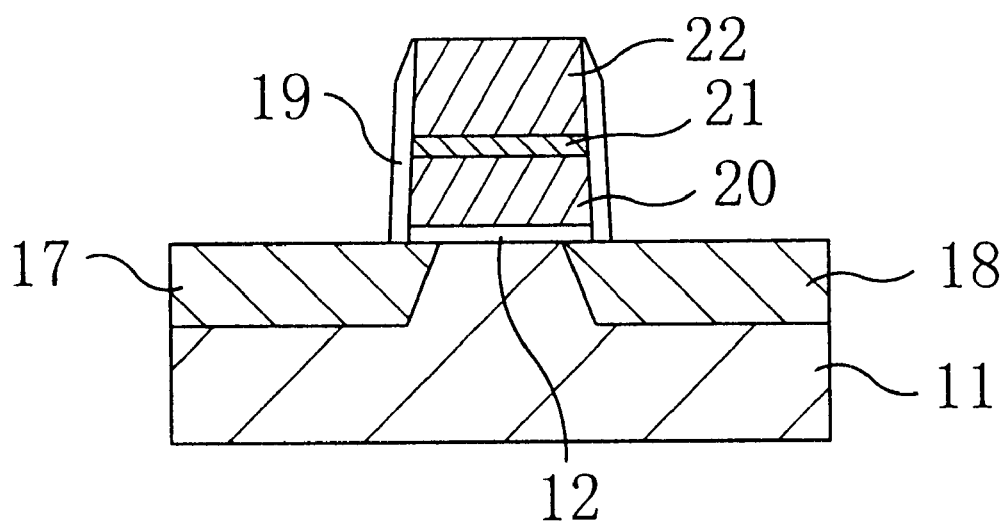
FIG. 7 is a cross-sectional view of a semiconductor device functioning as a nonvolatile semiconductor memory device according to the sixth embodiment of the present invention.

Next, the sixth embodiment of the present invention will be described. FIG. 7 is a cross-sectional view of a semiconductor device functioning as a nonvolatile semiconductor memory device of this embodiment.

As shown in FIG. 7, the device includes: a P-type Si substrate 11; an $SiO_2$ gate oxide film 12; N-type source/drain layers 17 and 18; a CVD insulator film 19 made of $SiO_2$ deposited by CVD; a polysilicon floating gate electrode 20; an ONO interlevel dielectric film 21 (i.e., a three-layered film in which a nitride film is sandwiched between a pair of oxide films); and a polysilicon control gate electrode 22.

The device of this embodiment is characterized in that the gate oxide film 12 is formed only under the floating gate electrode 20 and that the sidewall spacers 16a, 16b are formed on the gate oxide film 12 and the side faces of the control gate electrode 22, interlevel dielectric film 21 and floating gate electrode 20. Such a structure can be easily formed by patterning the gate oxide film 12 in the same shape as that of the control gate electrode 22, interlevel dielectric film 21 and floating gate electrode 20 in the step shown in FIG. 5(a) of the fourth embodiment and then performing the same process steps as those in FIGS. 5(b) and 5(c).

In this embodiment as well as in the fourth embodiment, it is also possible to suppress the deterioration in insulating properties of the gate oxide film 12 because of the passage of dopant ions through the ends of the floating gate electrode 20 during the implantation of dopant ions to form the source/drain layers 17 and 18. As a result, a nonvolatile semiconductor memory device including a highly insulating and reliable gate oxide film can be obtained. That is to say, rewriting can be performed in the nonvolatile semiconductor memory device a far greater number of times and various disturb characteristics can be improved.

In addition, since the floating gate electrode 20 is covered with the CVD insulator film 19, it is possible to prevent the dopants, introduced into the floating gate electrode 20, from diffusing toward external members. Consequently, a nonvolatile semiconductor memory device with less variable characteristics is realized.

Moreover, since the floating gate electrode 20 is covered with the CVD insulator film 19 of good quality, a nonvolatile semiconductor memory device excelling in charge retention characteristics can be obtained.

Embodiment 7

Next, the seventh embodiment of the present invention will be described. FIGS. 8(a) through 8(f) are cross-sectional views illustrating respective process steps for fabricating a semiconductor device functioning as a MOSFET of this embodiment.

Figure 8A:
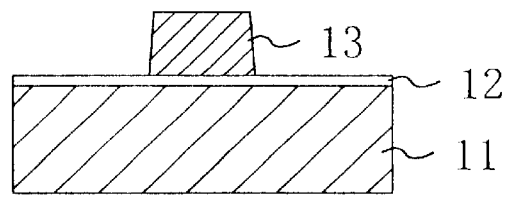
FIGS. 8(a) through 8(f) are cross-sectional views illustrating respective process steps for fabricating a semiconductor device functioning as a MOSFET according to the seventh embodiment of the present invention.
Figure 8B:
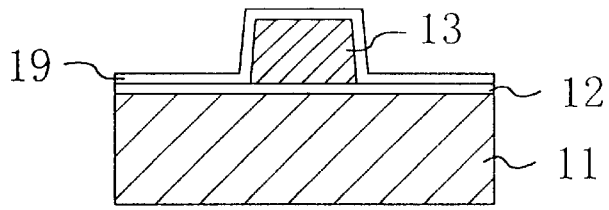
Figure 8C:
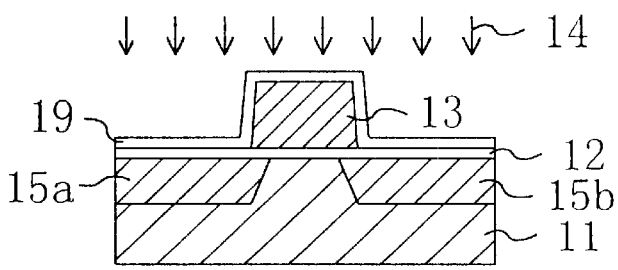
Figure 8D:
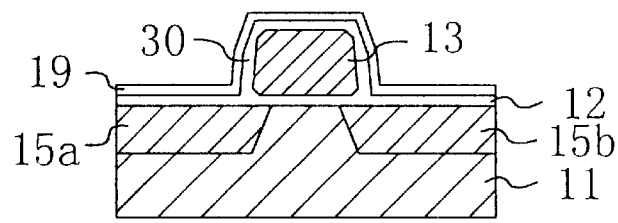
Figure 8E:
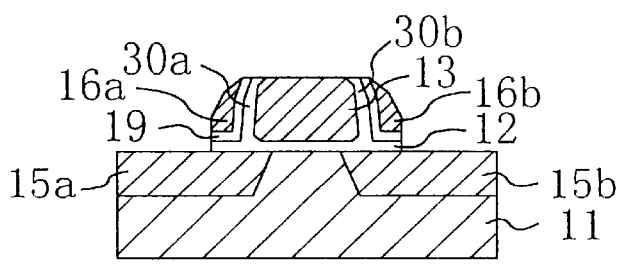
Figure 8F:
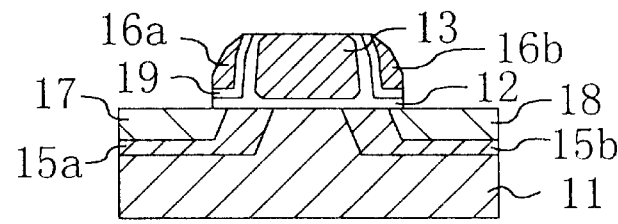

As shown in FIG. 8(f), the device includes: an Si substrate 11; a gate oxide film 12; a gate electrode 13; LDD layers 15a, 15b; sidewall spacers 16a, 16b; source/drain layers 17 and 18; a CVD insulator film 19; and a thermal oxide film 30. The CVD insulator film 19 is made of silicon dioxide deposited by a CVD process. In FIG. 8(c), the reference numeral 14 denotes arsenic ions implanted as dopant ions into the Si substrate 11 to form the LDD layers 15a and 15b.

First, in the process step shown in FIG. 8(a), a gate oxide film 12, made of silicon dioxide, is formed to be 9 nm thick by pyrogenic oxidation technique on a P-type silicon substrate 11. Then, a gate electrode 13, made of phosphorus-doped polysilicon, is formed thereon.

Next, in the process step shown in FIG. 8(b), a CVD insulator film 19, made of silicon dioxide, is deposited by RPCVD to be 15 nm thick over the substrate to cover the gate oxide film 12 and the gate electrode 13.

Then, in the process step shown in FIG. 8(c), arsenic ions 14 are implanted into the Si substrate 11 from above the gate electrode 13 and the CVD insulator film 19 to form N-type LDD layers 15a and 15b in the Si substrate 11 on both sides of the gate electrode 13. The implantation is performed under the conditions that the implant energy is 50 keV and the dose is $5 \times 10^{14}$ $cm^{-2}$, for example. Also, in order to make the LDD layers 15a and 15b extend to reach a region near the gate electrode 13, the ions are implanted at a tilt angle of about 25 degrees with respect to a normal of the substrate surface (where implantation is performed at four steps).

Then, in the process step shown in FIG. 8(d), rapid thermal annealing is conducted within an oxygen ambient (e.g., oxidizing and nitriding ambient) at 850° C. in order to repair the damage caused in the gate oxide film 12. As a result of this treatment, the Si substrate 11 and the gate electrode 13 are thermally oxidized to form a thermal oxide film 30 to be about 5 nm thick. During this process step, the gate oxide film 12 is slightly thickened except for its portion under the gate electrode 13 (i.e., its portion actually functioning as a gate insulator film). Also, the thickened region reaches the region under the gate electrode 13. Accordingly, small bird's beaks are formed at both ends of the portion of the gate oxide film 12 actually functioning as a gate insulator film.

Subsequently, in the process step shown in FIG. 8(e), a TEOS film is deposited over the substrate and etched anisotropically, thereby forming sidewall spacers 16a and 16b out of the TEOS film over the side faces of the gate electrode 13 with the CVD insulator film 19 interposed therebetween. During this process step, the gate oxide film 12, thermal oxide film 30 and CVD insulator film 19 on the Si substrate 11 are removed.

Finally, in the process step shown in FIG. 8(f), arsenic ions are implanted into the Si substrate 11 from above the gate electrode 13, CVD insulator film 19, thermal oxide film 30 and sidewall spacers 16a and 16b. As a result, N-type source/drain layers 17 and 18 are formed along the outer periphery of the LDD layers 15a and 15b. The implantation is performed under the conditions that the implant energy is 50 keV and the dose is $2 \times 10^{15}$ cm$^{-2}$, for example. Also, in order to prevent channeling, the ions are implanted at a tilt angle of about 7 degrees with respect to a normal of the substrate surface.

In accordance with the method of this embodiment, by covering the side faces of the gate electrode 13 with the CVD insulator film 19 in the process step shown in FIG. 8(b), the same effects as those of the first embodiment can also be attained. That is to say, since the passage of arsenic ions 14 through the ends of the gate electrode 13 can be suppressed in the process step shown in FIG. 8(c), the damage caused in the gate oxide film 12 can be reduced. Also, a long-time high-temperature heat treatment for forming a protective film is not performed and the CVD insulator film 19 is provided in this embodiment. Accordingly, formation of large bird's beaks in the portion of the gate oxide film 12 functioning as a gate insulator film and the diffusion of dopants such as phosphorus in the gate electrode 13 toward external members can be suppressed.

In addition, since a heat treatment is conducted within an oxidizing ambient in the step shown in FIG. 8(d), the gate oxide film 12, having received damage due to the implantation of arsenic ions 14 and had the insulating properties deteriorated, can be re-oxidized to recover its insulating properties. That is to say, although the passage of arsenic ions 14 through the gate electrode 13 can be satisfactorily suppressed in the step shown in FIG. 8(c), it is impossible to totally eliminate the passage. If thermal oxidation is conducted in such a case, then some reparation seems to happen to repair the damage caused in the gate oxide film 12. Specifically, silicon-oxide recombination might occur in the regions where silicon-oxygen atomic bonds have been broken. By adding a process step like this for repairing the damage caused in the gate oxide film 12, a semiconductor device including a more highly reliable gate oxide film 12 than that of the first or second embodiment can be obtained.

In this case, the thermal oxidation process illustrated in FIG. 8(d) is performed only briefly just to repair the damage caused in the gate oxide film 12, unlike the process step of forming a thermal oxide film as a protective film. Accordingly, not so large bird's beaks are formed in the gate oxide film 12. Thus, the variation or deterioration in characteristics of the device, which ordinarily happens in a conventional method because of a variable gate length, can be avoided.

In particular, since rapid thermal annealing is performed as a heat treatment within an oxynitriding ambient, the heat treatment can be minimized, resulting in a smaller degree of variation in characteristics. Thus, this method is advantageously applicable to the miniaturization of a semiconductor device.

It should be noted that the heat treatment within the oxidizing ambient shown in FIG. 8(d) may be performed not just for recovering the insulation properties of the gate oxide film 12 but for annealing the LDD layers 15a and 15b.

Furthermore, even if phosphorus ions are implanted to increase the breakdown voltage of the drain layer or boron or BF$_2$ ions are implanted to form a punch through stopper before or after the step shown in FIG. 8(c), the same effects as those of this exemplary embodiment can be attained.

Embodiment 8

Next, the eighth embodiment of the present invention will be described. FIGS. 9(a) through 9(f) are cross-sectional views illustrating respective process steps for fabricating a semiconductor device functioning as a MOSFET of his embodiment.

Figure 9A:
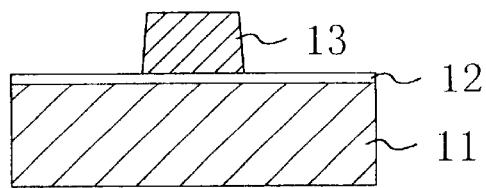
FIGS. 9(a) through 9(f) are cross-sectional views illustrating respective process steps for fabricating a semiconductor device functioning as a MOSFET according to the eighth embodiment of the present invention.
Figure 9B:
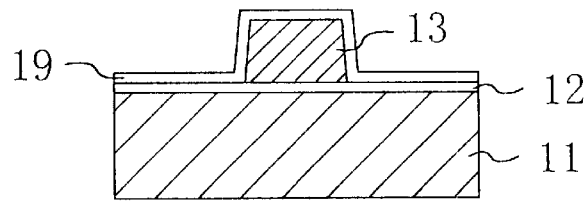
Figure 9C:
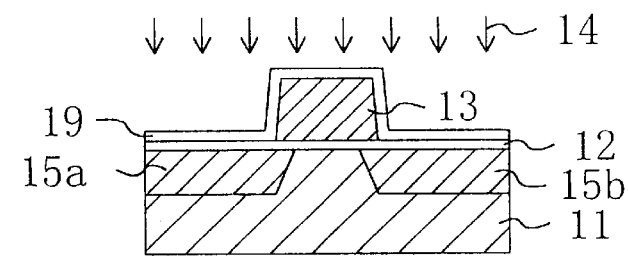
Figure 9D:
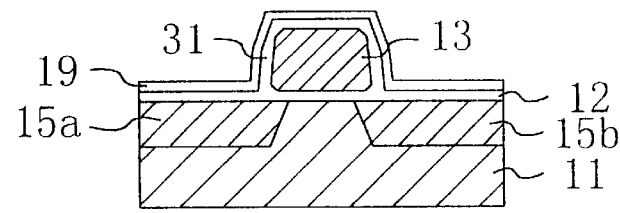
Figure 9E:
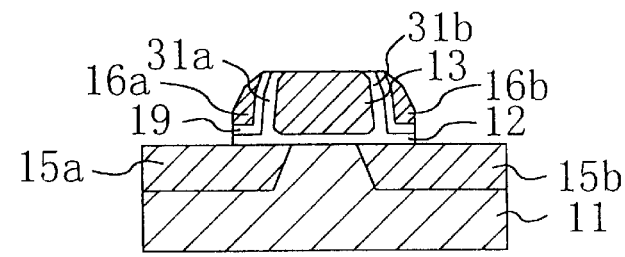
Figure 9F:
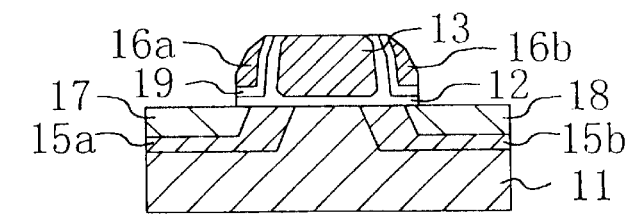

As shown in FIG. 9(f), the device includes: an Si substrate 11; a gate oxide film 12; a gate electrode 13; LDD layers 15a, 15b; sidewall spacers 16a, 16b; source/drain layers 17, 18; a CVD insulator film 19; and an oxynitride film 31. The CVD insulator film 19 is made of silicon dioxide deposited by a CVD process. In FIG. 9(c), the reference numeral 14 denotes arsenic ions implanted as dopant ions into the Si substrate 11 to form the LDD layers 15a and 15b.

First, in the process step shown in FIG. 9(a), a gate oxide film 12, made of silicon dioxide, is formed to be 9 nm thick by pyrogenic oxidation technique on a P-type silicon substrate 11. Then, a gate electrode 13, made of phosphorus-doped polysilicon, is formed thereon.

Next, in the process step shown in FIG. 9(b), a CVD insulator film 19, made of silicon dioxide, is deposited by RPCVD to be 15 nm thick over the substrate to cover the gate oxide film 12 and the gate electrode 13.

Then, in the process step shown in FIG. 9(c), arsenic ions 14 are implanted into the Si substrate 11 from above the gate electrode 13 and the CVD insulator film 19 to form N-type LDD layers 15a and 15b in the Si substrate 11 on both sides of the gate electrode 13. The implantation is performed under the conditions that the implant energy is 50 keV and the dose is $5 \times 10^{14}$ cm$^{-2}$, for example. Also, in order to make the LDD layers 15a and 15b extend to reach a region near the gate electrode 13, the ions are implanted at a tilt angle of about 25 degrees with respect to a normal of the substrate surface (where implantation is performed at four steps).

Subsequently, in the process step shown in FIG. 9(d), rapid thermal annealing is conducted for repairing the damage caused in the gate oxide film 12 within an N$_2$O ambient (i.e., oxidizing and nitriding ambient) at 1000° C. As a result of this treatment, the Si substrate 11 and the gate electrode 13 are oxidized and nitrided to form a very thin oxynitride film 31 to be about 3 nm thick. During this process step, the gate oxide film 12 is slightly thickened except for its portion under the gate electrode 13 (i.e., the portion actually functioning as a gate insulator film). Also, since the thickened region reaches the region under the gate electrode 13, small bird's beaks are formed at both ends of the portion of the gate oxide film 12 actually functioning as the gate insulator film.

Subsequently, in the process step shown in FIG. 9(e), a TEOS film is deposited over the substrate and etched anisotropically, thereby forming sidewall spacers 16a and 16b out of the TEOS film over the side faces of the gate electrode 13 with the CVD insulator film 19 interposed therebetween.

Finally, in the process step shown in FIG. 9(f), arsenic ions are implanted into the Si substrate 11 from above the gate electrode 13, CVD insulator film 19 and sidewall spacers 16a and 16b. As a result, N-type source/drain layers 17 and 18 are formed in the Si substrate 11 along the outer periphery of the LDD layers 15a and 15b. The implantation is performed under the conditions that the implant energy is 50 keV and the dose is $2 \times 10^{15}$ cm$^{-2}$, for example. Also, in order to prevent channeling, the ions are implanted at a tilt angle of about 7 degrees with respect to a normal of the substrate surface.

In accordance with the method of this embodiment, by covering the side faces of the gate electrode 13 with the CVD insulator film 19 in the step shown in FIG. 9(b), the same effects as those of the seventh embodiment can also be attained. That is to say, since the passage of arsenic ions 14 through the ends of the gate electrode 13 can be suppressed in the step shown in FIG. 9(c), the damage caused in the gate oxide film 12 can be reduced. Also, a long-time high-temperature heat treatment for forming a protective film is not performed and the CVD insulator film 19 is provided in this embodiment. Accordingly, formation of large bird's beaks and diffusion of dopants such as phosphorus in the gate electrode 13 toward external members can be suppressed.

In addition, since a heat treatment is conducted within an oxidizing and nitriding ambient in the step shown in FIG. 9(d), the gate oxide film 12, having received damage due to the implantation of arsenic ions 14 and had the insulating properties deteriorated, can be re-oxidized to recover its insulating properties. Furthermore, since the gate oxide film 12 is also nitrided during this process step, dangling bonds existing between the Si substrate 11 and the gate oxide film 12 can be repaired. Accordingly, deterioration in characteristics of the gate oxide film 12 after the application of electrical stress can be alleviated and electron trapping in the gate oxide film 12 can be reduced. As a result, a semiconductor device including a very highly reliable gate oxide film can be obtained. In other words, the reliability of the semiconductor device can be tremendously improved.

Moreover, since rapid thermal annealing is performed as a heat treatment within an oxidizing and nitriding ambient, the heat treatment can be minimized, resulting in a smaller degree of variation in characteristics. Thus, this method is advantageously applicable to the miniaturization of a semiconductor device.

Furthermore, since the oxidizing and nitriding step shown in FIG. 9(d) is rapid thermal annealing, the bird's beaks formed in the gate oxide film 12, if any, are extremely small. Thus, variation or deterioration in characteristics of the device, which ordinarily happens in a conventional method because of a variable gate length, can be avoided. And the fabrication process of this embodiment is more suitable for the miniaturization of a MOSFET.

It should be noted that the heat treatment within the oxidizing and nitriding ambient shown in FIG. 9(d) may be performed not just for recovering the insulation properties of the gate oxide film 12 but for annealing the LDD layers 15a and 15b.

Furthermore, even if phosphorus ions are implanted to increase the breakdown voltage of the drain layer or boron or BF$_2$ ions are implanted to form a punch through stopper before or after the step shown in FIG. 9(c), the same effects as those of this exemplary embodiment can be attained.

Embodiment 9

Next, the ninth embodiment of the present invention will be described. FIGS. 10(a) through 10(f) are cross-sectional views illustrating respective process steps for fabricating a semiconductor device functioning as a MOSFET of this embodiment.

Figure 10A:
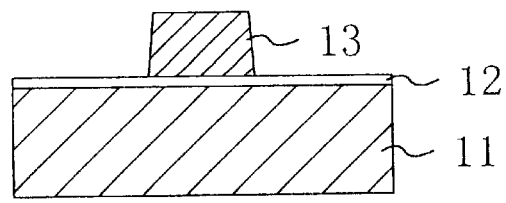
FIGS. 10(a) through 10(f) are cross-sectional views illustrating respective process steps for fabricating a semiconductor device functioning as a MOSFET according to the ninth embodiment of the present invention.
Figure 10B:
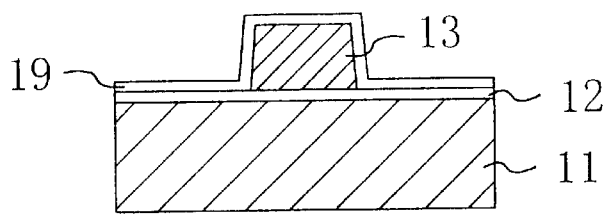
Figure 10C:
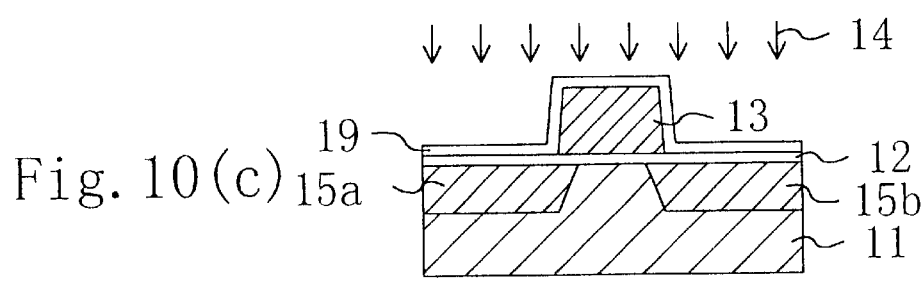
Figure 10D:
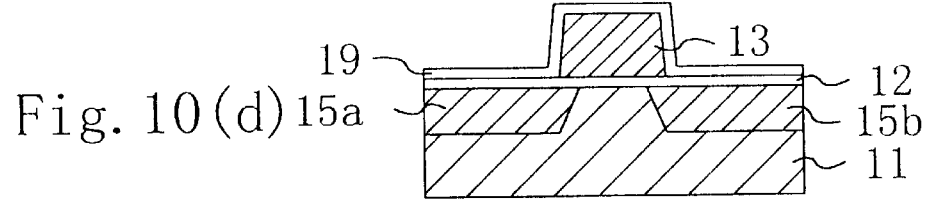
Figure 10E:
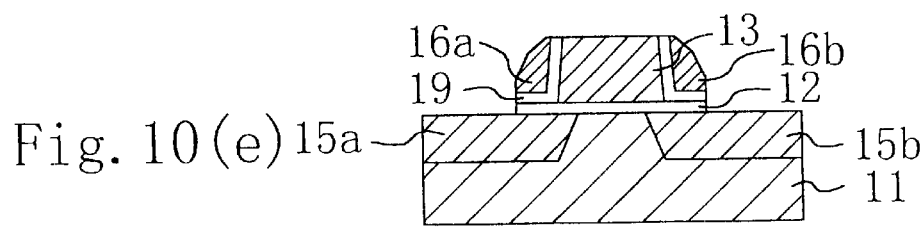
Figure 10F:
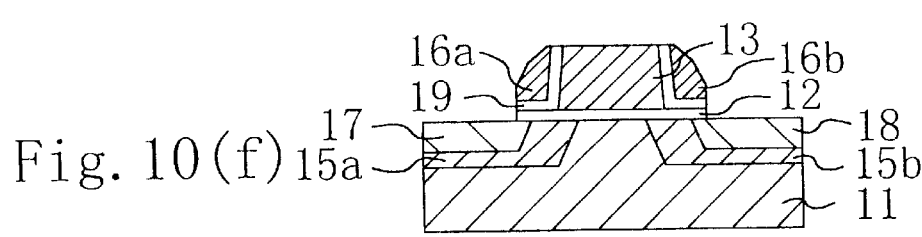

As shown in FIG. 10(f), the device includes: an Si substrate 11; a gate oxide film 12; a gate electrode 13; LDD layers 15a, 15b; sidewall spacers 16a, 16b; source/drain layers 17, 18; and a CVD insulator film 19. The CVD insulator film 19 is made of silicon dioxide deposited by a CVD process. In FIG. 10(c), the reference numeral 14 denotes arsenic ions implanted as dopant ions into the Si substrate 11 to form the LDD layers 15a and 15b.

First, in the process step shown in FIG. 10(a), a gate oxide film 12, made of silicon dioxide, is formed to be 9 nm thick by pyrogenic oxidation technique on a P-type silicon substrate 11. Then, a gate electrode 13 made of phosphorus-doped polysilicon is formed thereon.

Next, in the process step shown in FIG. 10(b), a CVD insulator film 19, made of silicon dioxide, is deposited by RPCVD to be 25 nm thick over the substrate to cover the gate oxide film 12 and the gate electrode 13.

Thereafter, in the process step shown in FIG. 10(c), arsenic ions 14 are implanted into the Si substrate 11 from above the gate electrode 13 and the CVD insulator film 19 to form N-type LDD layers 15a, 15b in the Si substrate 11 on both sides of the gate electrode 13. The implantation is performed under the conditions that the implant energy is 50 keV and the dose is $5 \times 10^{14}$ cm$^{-2}$, for example. Also, in order to make the LDD layers 15a and 15b extend to reach a region near the gate electrode 13, the ions are implanted at a tilt angle of about 25 degrees with respect to a normal of the substrate surface (where implantation is performed at four steps).

Subsequently, in the process step shown in FIG. 10(d), rapid thermal annealing is conducted within a nitriding ambient containing NO, NH$_3$ or the like at 1050° C. As a result of this treatment, both ends of the portion of the gate oxide film 12 under the gate electrode 13 (i.e., its portion actually functioning as a gate insulator film) are nitrided. However, neither the oxide film 30 of the seventh embodiment nor the oxynitride film 31 of the eighth embodiment is formed. Bird's beaks are not formed in the gate oxide film 12, either.

Subsequently, in the process step shown in FIG. 10(e), a TEOS film is deposited over the substrate and etched anisotropically, thereby forming sidewall spacers 16a and 16b over the side faces of the gate electrode 13 with the CVD insulator film 19 interposed therebetween.

Finally, in the process step shown in FIG. 10(f), arsenic ions are implanted into the Si substrate 11 from above the gate electrode 13, CVD insulator film 19 and sidewall spacers 16a and 16b. As a result, N-type source/drain layers 17 and 18 are formed along the outer periphery of the LDD layers 15a and 15b. The implantation is performed under the conditions that the implant energy is 50 keV and the dose is $2 \times 10^{15}$ cm$^{-2}$, for example. Also, in order to prevent channeling, the ions are implanted at a tilt angle of about 7 degrees with respect to a normal of the substrate surface.

In accordance with the method of this embodiment, by covering the side faces of the gate electrode 13 with the CVD insulator film 19 in the step shown in FIG. 10(b), the same effects as those of the seventh embodiment can also be attained. That is to say, the damage caused by the arsenic ions 14 in the gate oxide film 12 can be reduced in the step shown in FIG. 10(c). Also, a long-time high-temperature heat treatment for forming a protective film is not performed and the CVD insulator film 19 is provided in this embodiment. Accordingly, formation of large bird's beaks and diffusion of dopants such as phosphorus in the gate electrode 13 toward external members can be suppressed.

In addition, since a heat treatment is conducted within an oxidizing and nitriding ambient in the step shown in FIG. 10(d), both ends of the gate oxide film 12 are nitrided. As a result, dangling bonds existing between the Si substrate 11 and the gate oxide film 12 can be repaired. Accordingly, deterioration in properties of the gate oxide film 12 after the application of electrical stress can be alleviated and electron trapping in the gate oxide film 12 can be reduced. Consequently, a MOSFET including a very highly reliable gate oxide film can be obtained. In other words, the reliability of the MOSFET can be tremendously improved.

Moreover, since rapid thermal annealing is performed as a heat treatment within an oxidizing and nitriding ambient, the heat treatment can be minimized, resulting in a smaller degree of variation in characteristics of the MOSFET. Thus, this method is advantageously applicable to the miniaturization of a MOSFET.

Furthermore, in the process step illustrated in FIG. 10(d) using a nitride, no bird's beaks are formed in the gate oxide film 12. Thus, variation or deterioration in characteristics of the device, which ordinarily happens in a conventional method because of a variable gate length, can be avoided. And the fabrication process of this embodiment is more suitable for the miniaturization of a MOSFET.

It should be noted that the heat treatment within the oxidizing and nitriding ambient shown in FIG. 10(d) may also be performed for annealing the LDD layers 15a and 15b.

Furthermore, even if phosphorus ions are implanted to increase the breakdown voltage of the drain layer or boron or BF$_2$ ions are implanted to form a punch through stopper before or after the step shown in FIG. 10(c), the same effects as those of this exemplary embodiment can be attained.

Embodiment 10

Next, the tenth embodiment of the present invention will be described. FIGS. 11(a) through 11(d) are cross-sectional views illustrating respective process steps for fabricating a semiconductor device functioning as a nonvolatile semiconductor memory device of this embodiment.

Figure 11A:
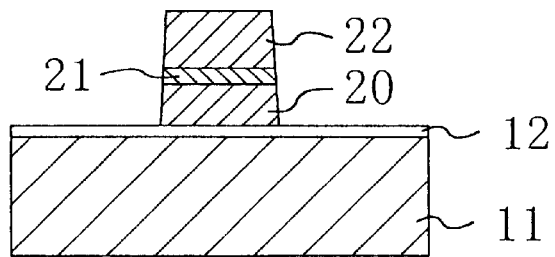
FIGS. 11(a) through 11(d) are cross-sectional views illustrating respective process steps for fabricating a semiconductor device functioning as a nonvolatile semiconductor memory device according to the tenth embodiment of the present invention.
Figure 11B:
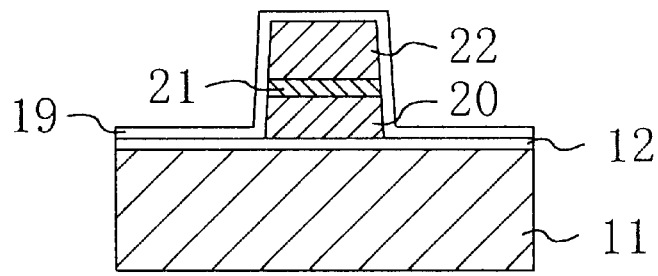
Figure 11C:
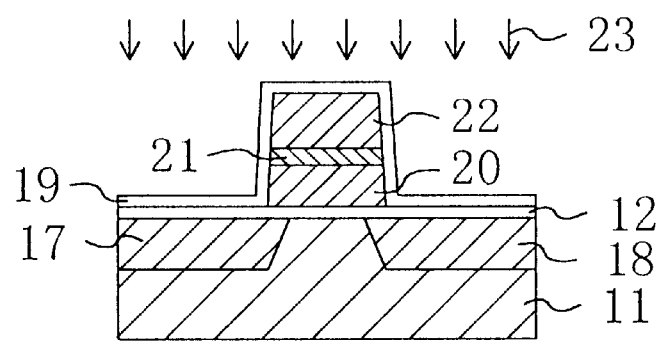
Figure 11D:
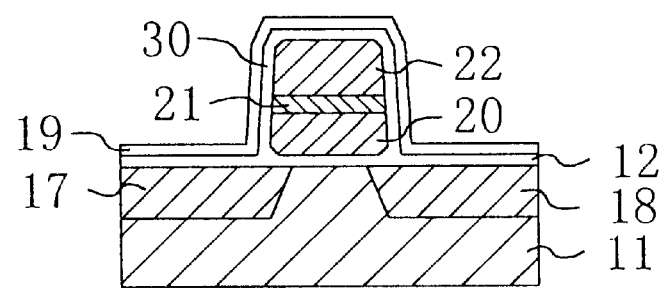

As shown in FIG. 11(d), the device includes: an Si substrate 11; a gate oxide film 12; source/drain layers 17, 18; an insulator film 19 deposited by CVD; a floating gate electrode 20; an interlevel dielectric film 21; a control gate electrode 22; and a thermal oxide film 30. In FIG. 4(c), the reference numeral 23 denotes phosphorus ions implanted as dopant ions into the Si substrate 11 to form the source/drain layers 17 and 18.

First, in the process step shown in FIG. 11(a), a gate oxide film 12, made of silicon dioxide, is formed to be 9 nm thick by a pyrogenic oxidation technique on a P-type silicon substrate 11. Then, a floating gate electrode 20 made of phosphorus-doped polysilicon, an ONO interlevel dielectric film 21 (three-layered film in which a nitride film is sandwiched between a pair of oxide films) and a control gate electrode 22 made of phosphorus-doped polysilicon are sequentially stacked thereon.

Next, in the process step shown in FIG. 11(b), a CVD insulator film 19, made of silicon dioxide, is deposited by RPCVD to be 20 nm thick over the substrate to cover the gate oxide film 12 and the multilevel structure including the floating gate electrode 20, interlevel dielectric film 21 and control gate electrode 22.

Subsequently, in the process step shown in FIG. 11(c), phosphorus ions 23 are implanted into the Si substrate 11 from above the control gate electrode 22, interlevel dielectric film 21 and floating gate electrode 20 covered with the CVD insulator film 19 to form N-type source/drain layers 17, 18 in the Si substrate 11 on both sides of the floating gate electrode 20. The implantation is performed under the conditions that the implant energy is 70 keV and the dose is $5\times10^{15}$ cm$^{-2}$, for example. Also, in order to prevent channeling, the ions are implanted at a tilt angle of about 7 degrees with respect to a normal of the substrate surface.

Then, in the process step shown in FIG. 11(d), a heat treatment is conducted within an oxygen ambient at 850° C. to repair the damage caused in the gate oxide film 12. As a result of this treatment, the Si substrate 11, control gate electrode 22 and floating gate electrode 20 are thermally oxidized to form a thermal oxide film 30 to be about 8 nm thick. During this process step, the gate oxide film 12 is slightly thickened except for its portion under the floating gate electrode 20 (i.e., its portion actually functioning as a gate insulator film). Also, since the thickened region reaches the region under the floating gate electrode 20, small bird's beaks are formed at both ends of the portion of the gate oxide film 12 actually functioning as a gate insulator film. Similarly, both ends of the oxide films sandwiching the nitride film in the interlevel dielectric film 21 are also slightly thickened to form small bird's beaks in the interlevel dielectric film 21.

In accordance with the method of this embodiment, the side faces of the control gate and floating gate electrodes 22, 20 are covered with the CVD insulator film 19 in the step shown in FIG. 11(b). Thus, the same effects as those of the third embodiment can be attained. That is to say, it is possible to suppress the passage of arsenic ions 14 through the ends of the floating gate and control gate electrodes 20, 22 in the step shown in FIG. 11(c). As a result, the damage caused in the gate oxide film 12 and the interlevel dielectric film 21 can be reduced. Also, a long-time hightemperature heat treatment for forming a protective film is not performed and the CVD insulator film 19 is provided in this embodiment. Accordingly, formation of large bird's beaks and diffusion of dopants such as phosphorus in the gate electrodes 22, 20 toward external members can be suppressed.

In addition, since a heat treatment is conducted within an oxidizing ambient in the step shown in FIG. 11(d), the gate oxide film 12 and the interlevel dielectric film 21, having received damage due to the implantation of arsenic ions 14 and had the insulating properties deteriorated, can be re-oxidized to recover their insulating properties. That is to say, although the passage of arsenic ions 14 through the respective gate electrodes 22, 20 can be considerably suppressed in the step shown in FIG. 11(c), it is impossible to totally eliminate the passage. If thermal oxidation is conducted in such a case, then some reparation seems to happen to repair the damage caused in the gate oxide film 12 and the interlevel dielectric film 21. Specifically, silicon-oxide recombination might occur in the regions where silicon-oxygen atomic bonds have be en broken. By adding a process step like this for repairing the damage caused in the gate oxide film 12 through thermal oxidation, rewriting can be performed in the nonvolatile semiconductor memory device a far greater number of times and various disturb characteristics can be improved.

In this case, the thermal oxidation process illustrated in FIG. 11(d) is performed just to repair the damage caused in the gate oxide film 12 and the interlevel dielectric film 21, unlike a process step of forming a thermal oxide film as a protective film. Accordingly, not so large bird's beaks are formed in the gate oxide film 12 and the interlevel dielectric film 21. Thus, it is possible to reduce the variation in threshold voltage resulting from a variable gate length in a conventional method. And it is also possible to suppress the variation in characteristics of the device, which is ordinarily caused due to the local application of stress to both ends of the interlevel dielectric film 21.

In particular, since rapid thermal annealing is performed as a heat treatment within an oxidizing ambient, the heat treatment can be minimized, resulting in a smaller degree of variation in characteristics of the nonvolatile semiconductor memory device. This method is also applicable to miniaturization of a nonvolatile semiconductor memory device.

Moreover, since the floating gate electrode 20 is covered with the CVD insulator film 19 of good quality, a nonvolatile semiconductor memory device excelling in charge retention characteristics can be obtained.

It should be noted that before or after the step of implanting phosphorus ions 23 shown in FIG. 11(c), arsenic ions may be implanted into the Si substrate 11 to increase a concentration at the surface and thereby facilitate the extraction of electrons. Alternatively, B (boron) or $BF_2$ ions may also be implanted through the CVD insulator film 19 and the gate oxide film 12 into the Si substrate 11 to form a P-type layer as a threshold controlling layer or a punch through stopper. It is clear that the same effects as those of this embodiment can be attained even in those cases.

Figure 14:
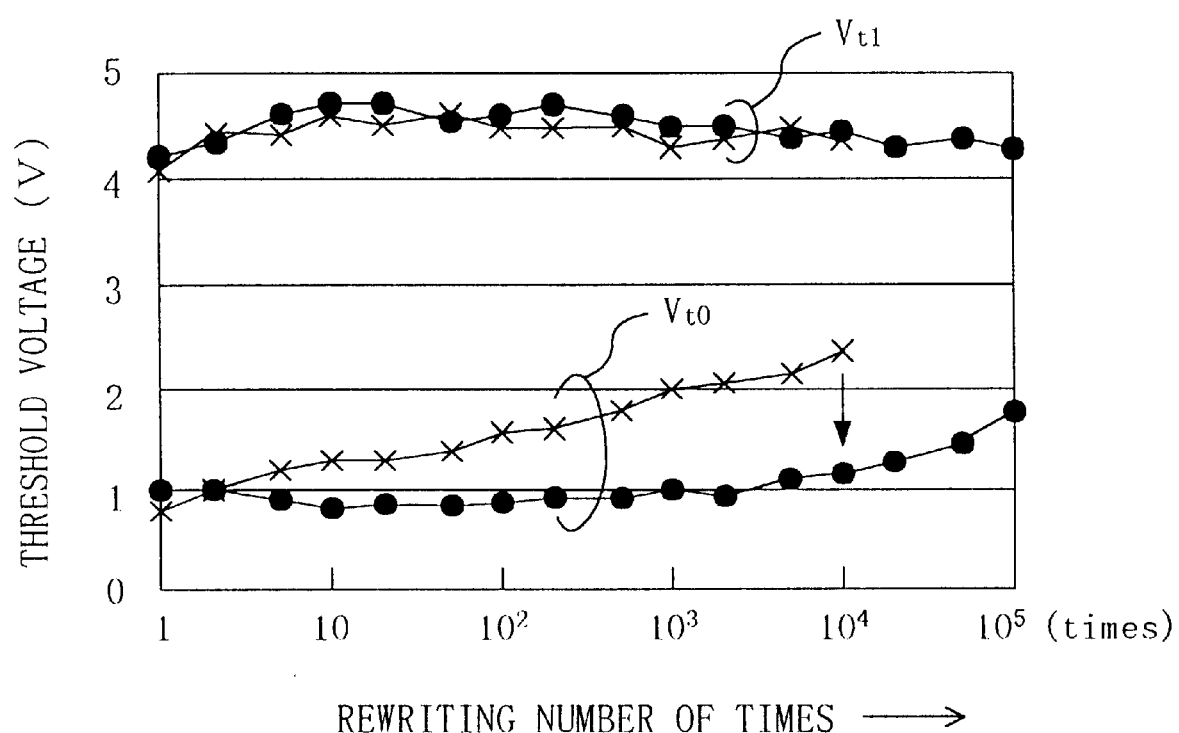
FIG. 14 is a graph illustrating in comparison data about the maximum numbers of times rewriting can be performed in respective nonvolatile semiconductor memory devices fabricated by the methods of the third and tenth embodiments.
Figure 15A:
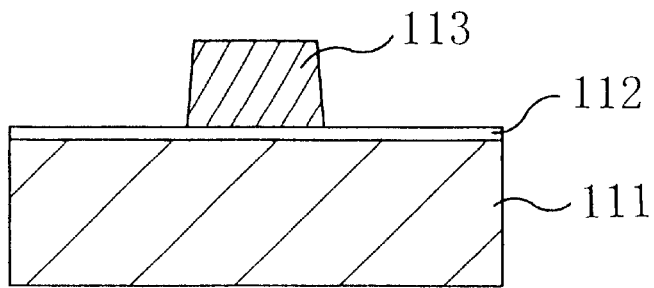
FIGS. 15(a) through 15(d) are cross-sectional views illustrating respective process steps for fabricating a semiconductor device functioning as a MOSFET in the prior art.
Figure 15B:
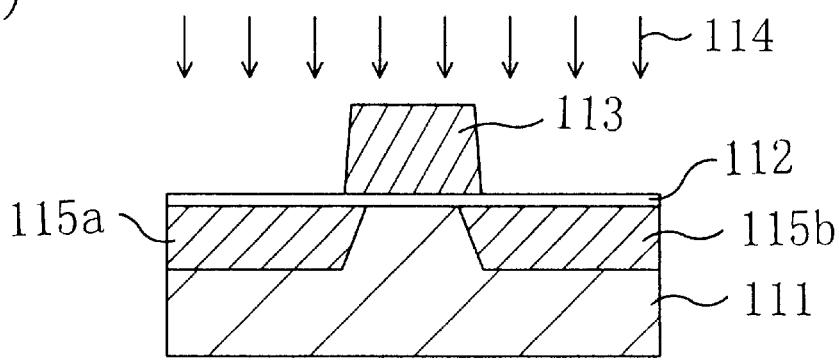
Figure 15C:
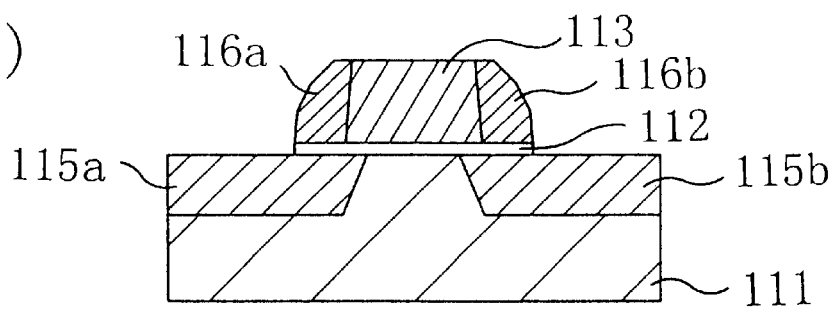
Figure 15D:
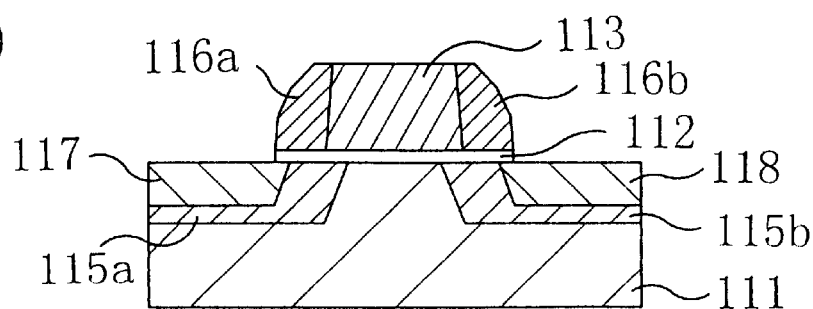

FIG. 14 is a graph illustrating in comparison data about the maximum numbers of times rewriting can be performed in respective nonvolatile semiconductor memory devices fabricated by the methods of the third and tenth embodiments. In FIG. 14, the axis of abscissas indicates the maximum number of times rewriting is performed, while the axis of ordinates indicates the threshold voltage (V). Vt1 indicates threshold voltages where electrons are injected into the floating gate electrode 20, while VtO indicates threshold voltages where electrons are ejected out of the floating gate electrode 20. The threshold voltages of a nonvolatile semiconductor memory device fabricated by the method of the third embodiment are identified with X, while the threshold voltages of a nonvolatile semiconductor memory device fabricated by the method of the tenth embodiment are identified with ●. We confirmed that the threshold voltage of the nonvolatile semiconductor memory device fabricated by the method of the third embodiment is less variable than the threshold voltage (not shown) of a nonvolatile semiconductor memory device fabricated by the conventional method. It was also confirmed that the threshold voltage increases in device of the third embodiment less than the conventional device while electrons are being ejected. As shown in FIG. 14, the increase in threshold voltage is very small in the nonvolatile semiconductor memory device fabricated by the method of the tenth embodiment during the ejection of electrons. Thus, according to the method of this embodiment, rewriting can be performed a considerably larger number of times and various disturb characteristics can be tremendously improved in the nonvolatile semiconductor memory device.

Embodiment 11

Next, the eleventh embodiment of the present invention will be described. FIGS. 12(a) through 12(d) are cross-sectional views illustrating respective process steps for fabricating a semiconductor device functioning as a nonvolatile semiconductor memory device of this embodiment.

Figure 12A:
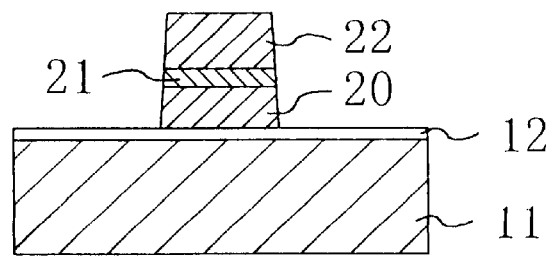
FIGS. 12(a) through 12(d) are cross-sectional views illustrating respective process steps for fabricating a semiconductor device functioning as a nonvolatile semiconductor memory device according to the eleventh embodiment of the present invention.
Figure 12B:
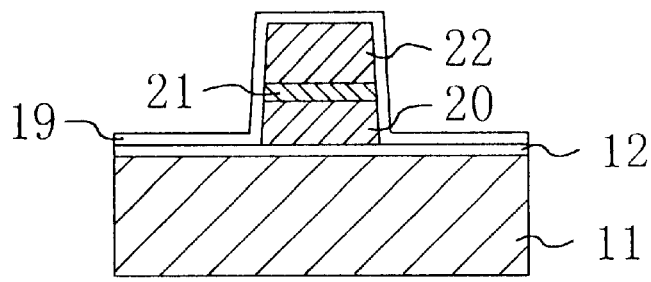
Figure 12C:
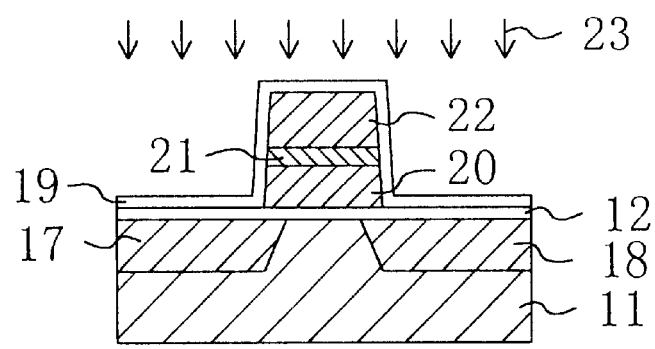
Figure 12D:
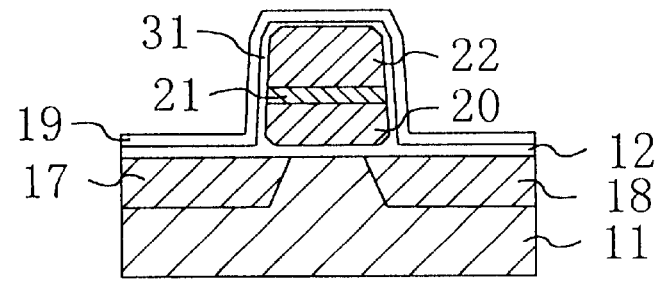

As shown in FIG. 12(d), the device includes: an Si substrate 11; a gate oxide film 12; source/drain layers 17, 18; an insulator film 19 deposited by CVD; a floating gate electrode 20; an interlevel dielectric film 21; a control gate electrode 22; and an oxynitride film 31. In FIG. 12(c), the reference numeral 23 denotes phosphorus ions implanted as dopant ions into the Si substrate 11 to form the source/drain layers 17 and 18.

First, in the process step shown in FIG. 12(a), a gate oxide film 12, made of silicon dioxide, is formed to be 9 nm thick by a pyrogenic oxidation technique on a P-type silicon substrate 11. Then, a floating gate electrode 20 made of phosphorus-doped polysilicon, an ONO interlevel dielectric film 21 (three-layered film in which a nitride film is sandwiched between a pair of oxide films) and a control gate electrode 22 made of phosphorus-doped polysilicon are sequentially stacked thereon.

Next, in the process step shown in FIG. 12(b), a CVD insulator film 19, made of silicon dioxide, is deposited by RPCVD to be 20 nm thick over the substrate to cover the gate oxide film 12 and the multilevel structure including floating gate electrode 20, interlevel dielectric film 21 and control gate electrode 22.

Subsequently, in the process step shown in FIG. 12(c), phosphorus ions 23 are implanted into the Si substrate 11 from above the control gate electrode 22, interlevel dielectric film 21 and floating gate electrode 20 covered with the CVD insulator film 19. As a result, N-type source/drain layers 17 and 18 are formed in the Si substrate 11 on both sides of the floating gate electrode 20. The implantation is performed under the conditions that the implant energy is 70 keV and the dose is $5 \times 10^{15}$ $cm^{-2}$, for example. Also, in order to prevent channeling, the ions are implanted at a tilt angle of about 7 degrees with respect to a normal of the substrate surface.

Then, in the process step shown in FIG. 12(d), a heat treatment is conducted within an oxidizing and nitriding ambient containing $N_2O$ at 1000° C. to repair the damage caused in the gate oxide film 12. As a result of this treatment, the Si substrate 11, control gate electrode 22 and floating gate electrode 20 are oxidized and nitrided to form an oxynitride film 31 to be about 3 nm thick. During this process step, the gate oxide film 12 is slightly thickened except for its portion under the floating gate electrode 20 (i.e., its portion actually functioning as a gate insulator film). Also, the thickened region reaches the region under the floating gate electrode 20. Accordingly, very small bird's beaks are formed at both ends of the portion of the gate oxide film 12 actually functioning as a gate insulator film. Similarly, both ends of the oxide films sandwiching the nitride film in the interlevel dielectric film 21 are also slightly thickened to form very small bird's beaks in the interlevel dielectric film 21.

In accordance with the method of this embodiment, the side faces of the control gate and floating gate electrodes 22, 20 are covered with the CVD insulator film 19 in the step shown in FIG. 12(b). Thus, the same effects as those of the tenth embodiment can be attained. That is to say, it is possible to suppress the passage of arsenic ions 14 through the floating gate and control gate electrodes 20, 22 in the step shown in FIG. 12(c). As a result, the damage caused in the gate oxide film 12 and the interlevel dielectric film 21 can be reduced. Also, a long-time high-temperature heat treatment for forming a protective film is not performed and the CVD insulator film 19 is provided in this embodiment. Accordingly, formation of large bird's beaks and diffusion of dopants such as phosphorus in the gate electrodes 22, 20 toward external members can be suppressed.

In addition, since a heat treatment is conducted within an oxidizing and nitriding ambient in the step shown in FIG. 12(d), the gate oxide film 12, having received damage due to the implantation of phosphorus ions 23 and had the insulating properties deteriorated, can be re-oxidized to recover its insulating properties. At the same time, by nitriding the gate oxide film 12, deterioration in characteristics after the application of electrical stress can be alleviated and electron trapping can be reduced. As a result, a nonvolatile semiconductor memory device including a very highly reliable gate oxide film can be obtained. In other words, rewriting can be performed in the nonvolatile semiconductor memory device a far greater number of times and various disturb characteristics can be improved.

In this case, the oxidizing and nitriding process step illustrated in FIG. 12(d) is performed just to repair the damage caused in the gate oxide film 12 and the interlevel dielectric film 21, unlike a process step of forming a thermal oxide film as a protective film. And the oxidation action of the oxidizing and nitriding process step influences less than the thermal oxidation process of the tenth embodiment. Accordingly, only very small bird's beaks are formed in the gate oxide film 12 and the interlevel dielectric film 21 during this process step. Thus, it is possible to reduce the variation in threshold voltage resulting from a variable gate length in a conventional method. And it is also possible to suppress the variation in characteristics of the device, which is ordinarily caused due to the local application of stress to both ends of the interlevel dielectric film 21.

In particular, since rapid thermal annealing is performed as a heat treatment within an oxidizing and nitriding ambient, the heat treatment can be minimized, resulting in a smaller degree of variation in characteristics of the nonvolatile semiconductor memory device. Also, this method is advantageously applicable to the miniaturization of a nonvolatile semiconductor memory device.

Moreover, since the floating gate electrode 20 is covered with the CVD insulator film 19 of good quality, a nonvolatile semiconductor memory device excelling in charge retention characteristics can be obtained.

Furthermore, by covering the floating gate electrode 20 and the interlevel dielectric film 21 with the CVD insulator film 19, it is also possible to prevent phosphorus ions, doped into the floating gate electrode 20, from diffusing to reach external members. As a result, a nonvolatile semiconductor memory device with less variable characteristics can be advantageously obtained.

It should be noted that before or after the process step of implanting phosphorus ions 23 shown in FIG. 12(c), arsenic ions may be implanted into the Si substrate 11 to increase a concentration at the surface and thereby facilitate the extraction of electrons. Alternatively, B (boron) or $BF_2$ ions may also be implanted through the CVD insulator film 19 and the gate oxide film 12 into the Si substrate 11 to form a P-type layer as a threshold controlling layer or a punch through stopper. It is clear that the same effects as those of this embodiment can be attained even in those cases.

In this embodiment, the process step of implanting phosphorus ions 23 is performed to form the source/drain layers 17 and 18. Even when arsenic ions are implanted before or after this process step, the same effects as those of this embodiment can be naturally attained.

Embodiment 12

Next, the twelfth embodiment of the present invention will be described. FIGS. 13(a) through 13(d) are cross-sectional views illustrating respective process steps for fabricating a semiconductor device functioning as a nonvolatile semiconductor memory device of this embodiment.

Figure 13A:
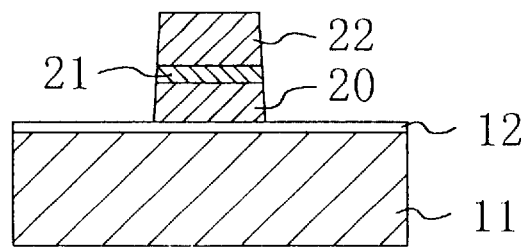
FIGS. 13(a) through 13(d) are cross-sectional views illustrating respective process steps for fabricating a semiconductor device functioning as a nonvolatile semiconductor memory device according to the twelfth embodiment of the present invention.
Figure 13B:
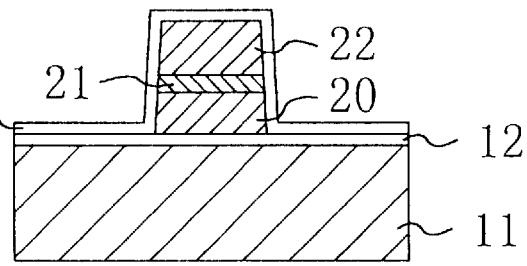
Figure 13C:
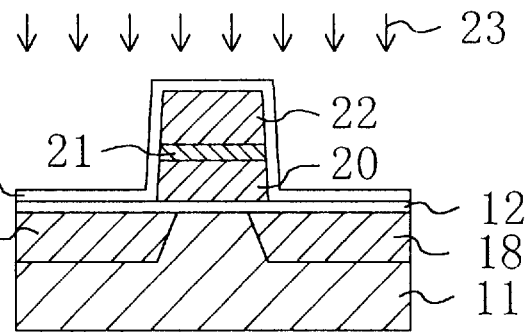
Figure 13D:
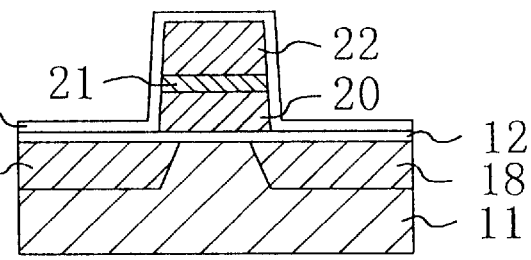

As shown in FIG. 13(d), the device includes: an Si substrate 11; a gate oxide film 12; source/drain layers 17, 18; an insulator film 19 deposited by CVD; a floating gate electrode 20; an interlevel dielectric film 21; and a control gate electrode 22. In FIG. 13(c), the reference numeral 23 denotes phosphorus ions implanted as dopant ions into the Si substrate 11 to form the source/drain layers 17 and 18.

First, in the process step shown in FIG. 13(a), a gate oxide film 12, made of silicon dioxide, is formed to be 9 nm thick by a pyrogenic oxidation technique on a P-type silicon substrate 11. Then, a floating gate electrode 20 made of phosphorus-doped polysilicon, an ONO interlevel dielectric film 21 (three-layered film in which a nitride film is sandwiched between a pair of oxide films) and a control gate electrode 22 made of phosphorus-doped polysilicon are sequentially stacked thereon.

Next, in the process step shown in FIG. 13(b), a CVD insulator film 19, made of silicon dioxide, is deposited by RPCVD to be 30 nm thick over the substrate to cover the gate oxide film 12 and the multilevel structure including floating gate electrode 20, interlevel dielectric film 21 and control gate electrode 22.

Subsequently, in the process step shown in FIG. 13(c), phosphorus ions 23 are implanted into the Si substrate 11 from above the control gate electrode 22, interlevel dielectric film 21 and floating gate electrode 20 covered with the CVD insulator film 19 to form N-type source/drain layers 17, 18 in the Si substrate 11 on both sides of the floating gate electrode 20. The implantation is performed under the conditions that the implant energy is 70 keV and the dose is $5 \times 10^{15}$ $cm^{-2}$, for example. Also, in order to prevent channeling, the ions are implanted at a tilt angle of about 7 degrees with respect to a normal of the substrate surface.

Then, in the process step shown in FIG. 13(d), rapid thermal annealing is conducted within a nitriding ambient containing NO, $NH_3$ or the like at 1050° C. As a result of this treatment, neither the thermal oxide film 30 of the tenth embodiment nor the oxynitride film 31 of the eleventh embodiment is formed. Bird's beaks are not formed in the gate oxide film 12 or the interlevel dielectric film 21, either.

In accordance with the method of this embodiment, the side faces of the control gate electrode 22 and the floating gate electrode 20 are covered with the CVD insulator film 19 in the step shown in FIG. 13(b). Thus, the same effects as those of the tenth embodiment can be attained. That is to say, it is possible to suppress the passage of arsenic ions 14 through the floating gate and control gate electrodes 20, 22 in the step shown in FIG. 13(c). Thus, the damage caused in the gate oxide film 12 and the interlevel dielectric film 21 can be reduced. Also, a long-time high-temperature heat treatment for forming a protective film is not performed and the CVD insulator film 19 is provided in this embodiment. Accordingly, formation of bird's beaks and diffusion of dopants such as phosphorus in the gate electrodes 22, 20 toward external members can be suppressed.

In addition, since a heat treatment is conducted within a nitriding ambient in the process step shown in FIG. 13(d) to nitride the gate oxide film 12, deterioration in characteristics after the application of electrical stress can be alleviated and electron trapping can be reduced. As a result, a nonvolatile semiconductor memory device including a very highly reliable gate oxide film 12 can be obtained. In other words, rewriting can be performed in the nonvolatile semiconductor memory device a far greater number of times and various disturb characteristics can be improved.

In addition, no bird's beaks are formed in the gate oxide film 12 and the interlevel dielectric film 21 during the nitride process shown in FIG. 13(d). Accordingly, it is possible to reduce the variation in threshold voltage resulting from a variable gate length in a conventional method. And it is also possible to suppress the variation in characteristics of the device, which is ordinarily caused due to the local application of stress to both ends of the interlevel dielectric film 21.

In particular, since rapid thermal annealing is performed as a heat treatment within a nitriding ambient, the heat treatment can be minimized, resulting in a smaller degree of variation in characteristics of the nonvolatile semiconductor memory device. Also, this method is advantageously applicable to the miniaturization of a nonvolatile semiconductor memory device.

Moreover, since the floating gate electrode 20 is covered with the CVD insulator film 19 of good quality, a nonvolatile semiconductor memory device excelling in charge retention characteristics can be obtained.

Furthermore, by covering the floating gate electrode 20 and the interlevel dielectric film 21 with the CVD insulator film 19, it is also possible to prevent phosphorus ions introduced into the floating gate electrode 20 from diffusing to reach external members. As a result, a nonvolatile semiconductor memory device with less variable characteristics can be advantageously obtained.

It should be noted that before or after the step of implanting phosphorus ions 23 shown in FIG. 13(c), arsenic ions may be implanted into the Si substrate 11 to increase a concentration at the surface and thereby facilitate the extraction of electrons. Alternatively, B (boron) or $BF_2$ ions may also be implanted through the CVD insulator film 19 and the gate oxide film 12 into the Si substrate 11 to form a P-type layer as a threshold controlling layer or a punch through stopper. It is clear that the same effects as those of this embodiment can be attained even in those cases.

Conditions of Heat Treatment

Rapid thermal annealing as the oxidizing, oxidizing/nitriding and nitriding processes in the seventh to twelfth embodiments is preferably conducted in the range from 800° C. to 1100° C. to attain the expected effects like damage repair while suppressing deterioration in characteristics of the device due to the diffusion of dopants. Also, in order to prevent the formation of bird's beaks, the heat treatment is preferably conducted for as short as 120 seconds or less.

In the foregoing seventh to twelfth embodiments, a protective oxide film may be provided instead of the CVD insulator film 19. In these embodiments, a thermal oxidation or oxidizing/nitriding process is performed as a subsequent process step to repair the damage. Accordingly, even if the thickness of a protective oxide film formed by the initial thermal oxidation is small, the diffusion of dopants still can be prevented without fail, because a new oxide film 30 or oxynitride film 31 is formed in the thermal oxidation or oxidizing/nitriding process. Accordingly, the formation of bird's beaks at both ends of the gate oxide film 12 and the interlevel dielectric film 21 can be minimized.

What is claimed is:

1. A method for fabricating a semiconductor device functioning as an MOS field effect transistor, the method comprising the steps of:
    a) forming a gate insulator film and a gate electrode on a semiconductor substrate in this order;
    b) forming a CVD insulator film to cover an exposed surface of the gate electrode by performing a CVD process;
    c) etching anisotropically the CVD insulator, film to form sidewalls made from the CVD insulator film on the side faces of the gate electrode after the step b) has been performed;
    d) forming impurity layers of a first conductivity type in the semiconductor substrate by implanting dopant ions into the semiconductor substrate from above the gate electrode and the sidewalls made from the CVD insulator film;
    e) forming a diffusion layer composed of a punch through stopper of a second conductivity type in the semiconductor substrate by implanting dopant ions into the semiconductor substrate before or after the step d) has been performed;
    f) forming sidewall spacers over the side faces of the gate electrode with sidewalls made from the CVD insulator film interposed therebetween, after the steps d and e) have been performed; and
    g) forming source/drain layers of the first conductivity type in the semiconductor substrate, after the step f) has been performed;
    wherein the impurity layers of the first conductivity type over-lapped the gate electrode.

2. The method of claim 1, wherein the CVD insulator film is composed of a silicon oxide film having a thickness in the range from 5 nm to 30 nm.

3. The method of claim 1, further comprising, after the steps d) and e) and before the step f), the step of conducting a heat treatment within an ambient containing at least oxygen to repair damage caused in the gate insulator film due to the implantation of the dopant ions.

4. The method of claim 3, wherein the step of conducting a heat treatment is performed within an oxidizing and nitriding ambient.

5. A method for fabricating a semiconductor device functioning as an MOS field effect transistor, the method comprising the steps of:
    a) forming a gate insulator film and a gate electrode on a semiconductor substrate in this order;
    b) forming a CVD insulator film over the entire surface of the semiconductor substrate after the step a) has been performed;
    c) forming impurity layers of a first conductivity type in the semiconductor substrate by implanting dopant ions into the semiconductor substrate from above the CVD insulator film that is formed over the entire surface and covering an exposed surface of the gate electrode;
    d) conducting a heat treatment within an oxidizing and nitriding ambient or a nitriding ambient to repair damage caused in the gate insulator film due to the implantation of the dopant ions after the step c) has been performed and where the CVD insulator film is formed over the entire surface of the semiconductor substrate;
    e) forming sidewall spacers over the side faces of the gate electrode with the CVD insulator film interposed therebetween after the step d) has been performed; and
    f) forming source/drain layers of the first conductivity type in the semiconductor substrate after the step e) has been performed;
    wherein the impurity layers of the first conductivity type over-lapped the gate electrode.

6. The method of claim 5, wherein in the step d), the heat treatment is conducted as rapid thermal annealing at a temperature in the range from 800° C. to 1100° C. within 120 seconds.

7. The method of claim 5, further comprises a step of forming a diffusion layer composed of a punch through stopper of a second conductivity type in the semiconductor substrate by implanting dopant ions into the semiconductor substrate before and after the step c) has been performed.

* * * * *

UNITED STATES PATENT AND TRADEMARK OFFICE
CERTIFICATE OF CORRECTION

PATENT NO. : 6,472,281 B2
DATED : October 29, 2002
INVENTOR(S) : Hiroyuki Doi et al.

It is certified that error appears in the above-identified patent and that said Letters Patent is hereby corrected as shown below:

<u>Title page,</u>
Item [73], Assignee, delete "Matsushita Electronics Corporation"
add -- Matsushita Electric Industrial Co., Ltd. --

Signed and Sealed this

Eighth Day of July, 2003

JAMES E. ROGAN
*Director of the United States Patent and Trademark Office*